US008443317B2

(12) United States Patent
Hiraoglu et al.

(10) Patent No.: US 8,443,317 B2
(45) Date of Patent: May 14, 2013

(54) TRANSFORMATION OF IC DESIGNS FOR FORMAL VERIFICATION

(75) Inventors: Muzaffer Hiraoglu, Chelmsford, MA (US); Peter Wilhelm Josef Zepter, Mountain View, CA (US)

(73) Assignee: Synopsys, Inc., Mountain View, CA (US)

( * ) Notice: Subject to any disclaimer, the term of this patent is extended or adjusted under 35 U.S.C. 154(b) by 397 days.

(21) Appl. No.: 12/511,987

(22) Filed: Jul. 29, 2009

(65) Prior Publication Data
US 2009/0293028 A1 Nov. 26, 2009

Related U.S. Application Data

(62) Division of application No. 11/495,136, filed on Jul. 28, 2006.

(51) Int. Cl.
*G06F 17/50* (2006.01)

(52) U.S. Cl.
USPC .................. 716/107; 716/104; 716/111

(58) Field of Classification Search ............... 716/104, 716/106, 107, 111; 703/16
See application file for complete search history.

(56) References Cited

U.S. PATENT DOCUMENTS

| | | | | |
|---|---|---|---|---|
| 5,553,000 A * | 9/1996 | Dey et al. | ....................... | 716/103 |
| 6,223,141 B1 * | 4/2001 | Ashar | ............................. | 703/14 |
| 6,336,206 B1 | 1/2002 | Lockyear | | |
| 6,668,362 B1 | 12/2003 | McIlwain et al. | | |
| 7,120,883 B1 * | 10/2006 | van Antwerpen et al. | .... | 716/102 |
| 7,171,634 B2 * | 1/2007 | Sawkar et al. | ................ | 716/104 |
| 7,360,185 B2 * | 4/2008 | Baumgarter et al. | ......... | 716/103 |
| 7,500,205 B2 * | 3/2009 | Paul et al. | ....................... | 716/132 |
| 7,996,800 B2 * | 8/2011 | Baumgarter et al. | ......... | 716/106 |
| 2005/0076316 A1 * | 4/2005 | Pierrat et al. | ...................... | 716/4 |
| 2005/0289498 A1 | 12/2005 | Sawkar et al. | | |
| 2006/0053398 A1 * | 3/2006 | Cox et al. | ........................ | 716/11 |
| 2006/0129961 A1 * | 6/2006 | Paul et al. | ......................... | 716/6 |
| 2006/0190869 A1 * | 8/2006 | Baumgartner et al. | ........... | 716/5 |
| 2008/0178132 A1 * | 7/2008 | Baumgarter et al. | ............. | 716/5 |

OTHER PUBLICATIONS

Entire Prosecution History of U.S. Appl. No. 11/495,136 filed on Jul. 28, 2006 by Muzaffer Hiraoglu et al.
"A Sequential Labeling Algorithm", Section 4.1.3, pp. 69-71 of book "Robot Vision" by Berthold K. P. Horn, The MIT Press, Cambridge, Massachusetts, 1986.
Lockyear, B. "Peripheral Retiming Applied to Circuit Verification", Synopsys, Inc., Advanced Technology Group, believed to be prior to Jul. 27, 2005.
Zif, P. "Retiming" presentation in Advanced Methods of CAD for Integrated Circuits, WS 2005/06, Darmstadt University of Technology, Institute of Microelectronic Systems, pp. 337-361.

(Continued)

*Primary Examiner* — Phallaka Kik
(74) *Attorney, Agent, or Firm* — Fenwick & West LLP

(57) ABSTRACT

A non-transitory computer readable storage media, a computer-implemented method and apparatus for electronic design automation are disclosed. A reference integrated circuit (IC) design and a remitted IC design are received. Instances of cells of the reference IC design and the retimed IC designed are replaced with replacement circuits based on a description of moves of retiming associated with the reference IC design and the synthesized IC design. A comparison of the reference IC design and the retimed IC designed is performed to determine whether the retimed IC design is equivalent to the transformed IC design.

22 Claims, 23 Drawing Sheets

OTHER PUBLICATIONS

Eckl, K. et al. "A Practical Approach to Multiple-Class Retiming", DAC 1999, New Orleans, Louisiana, pp. 237-242.

Leiserson, C. E. et al. "Optimizing synchronous circuitry by retiming", Proc. of the 3rd Caltech Conf. on VLSI, Mar. 1983, Pasadena, pp. 87-116.

Deokar, R. B. et al. "A Fresh Look at Retiming via Clock Skew Optimization", Proc. of the 32nd Design Automation Conference, Jun. 1995, San Francisco, pp. 310-315.

Shenoy, N. et al. "Efficient Implementation of Retiming", Proc. of ICCAD, Nov. 1994, San Jose, pp. 226-233.

Singh, D. P. et al. "Incremental Retiming for FPGA Physical Synthesis", Proc of the 42nd Design Automation Conference, Jun. 2005, Anaheim, pp. 433-438.

Mneimneh, M. et al. "Reverse: Efficient Sequential Verification for Retiming" published in "International Workshop on Logic and Synthesis", 2003.

Iyer, B. et al. "Metamorphosis: State Assignment by Retiming and Re-encoding" Proceedings of the 1996 IEEE/ACM International Conference on Computer-Aided Design San Jose, California, United States, pp. 614-617.

Vallelunga, R. et al. "Interoperable tools ease equivalence checking", published Feb. 3, 2003 by EE Times.

Formality ® Automated Setup File (SVF) Manual, Version X-2005.12, Dec. 2005, pp. 55.

Office Action dated Oct. 29, 2008 in U.S. Appl. No. 11/495,136, 14 pages.

Amendment dated Jan. 29, 2009 in U.S. Appl. No. 11/495,136, 30 pages.

Office Action dated Apr. 29, 2009 in U.S. Appl. No. 11/495,136, 6 pages.

Amendment dated May 29, 2009 in U.S. Appl. No. 11/495,136, 10 pages.

Final Office Action dated Sep. 14, 2009 in U.S. Appl. No. 11/495,136, 13 pages.

Amendment dated Feb. 16, 2010 in U.S. Appl. No. 11/495,136, 17 pages.

* cited by examiner

FIG. 4A
```
guide_retiming
 -design {ALU}
 -Boolean {Z = A and B}
 -direction {forward}
 -input {A:R1}
 -input {B:R2}
 -output {Z:X1}
```
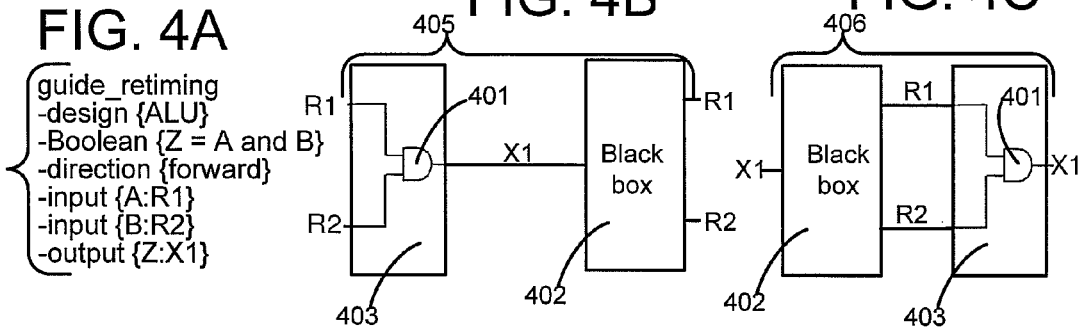
FIG. 4B
FIG. 4C
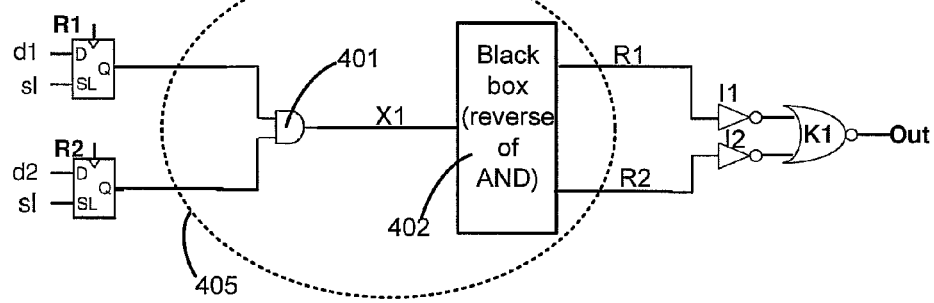
FIG. 4D
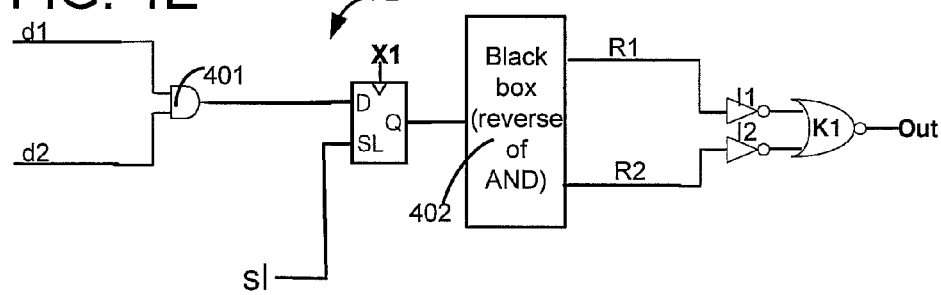
FIG. 4E
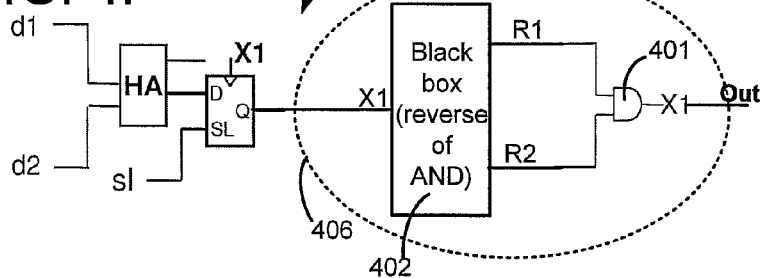
FIG. 4F

FIG. 6A
```
{ guide_retming
  -design {ALU}
  -libCell {AND}
  -direction {backward}
  -input {A:X1}
  -input {B:X2}
  -output {Z:R1}
```
FIG. 6B
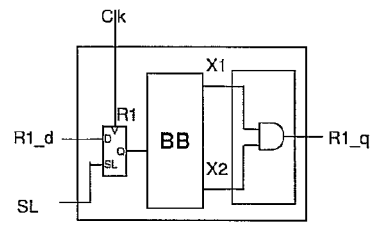
FIG. 6C
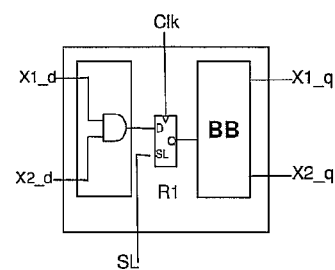
FIG. 6D
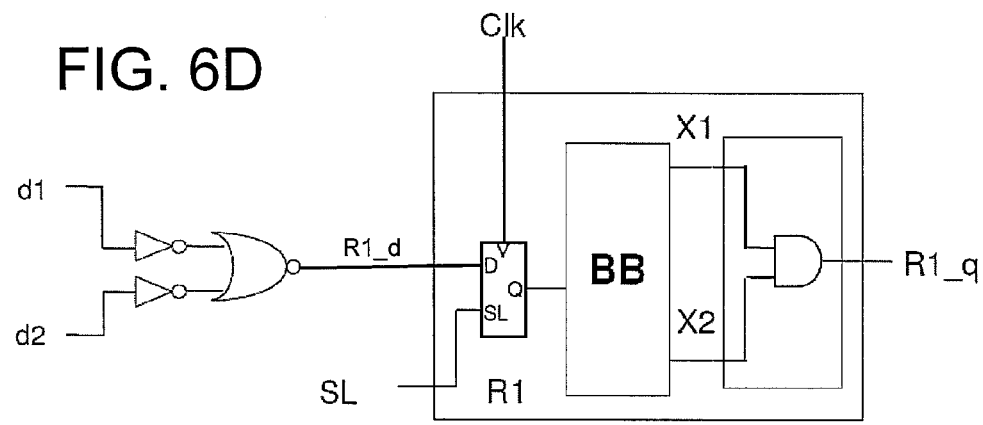
FIG. 6E
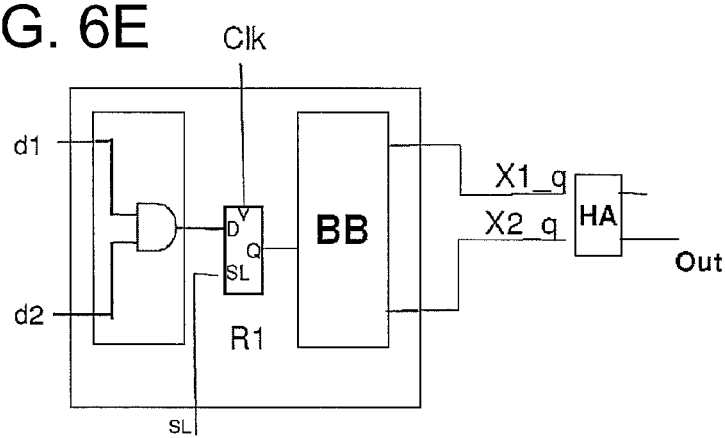

FIG. 7A
{
-guide_retming
-design {ALU}
-libCell {AND}
-direction {forward}
-input {A:R1}
-input {B:R2}
-output {Z:Temp1}
}
FIG. 7B
{
-guide_retming
-design {ALU}
-libCell {AND}
-direction {forward}
-input {A:Temp1}
-input {B:R3}
-output {Z:X1}
}
FIG. 7C
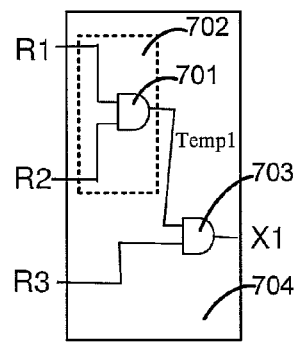
FIG. 7D
{
-guide_retming
-design {ALU}
-libCell {AND}
-direction {backward}
-input {A:Temp1}
-input {B:X3}
-output {Z:R1}
}
FIG. 7E
{
-guide_retming
-design {ALU}
-libCell {AND}
-direction {backward}
-input {A:X1}
-input {B:X2}
-output {Z:Temp1}
}
FIG. 7F
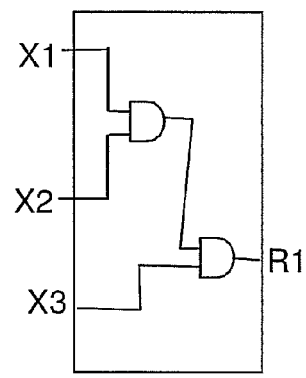

FIG. 8A (prior art)
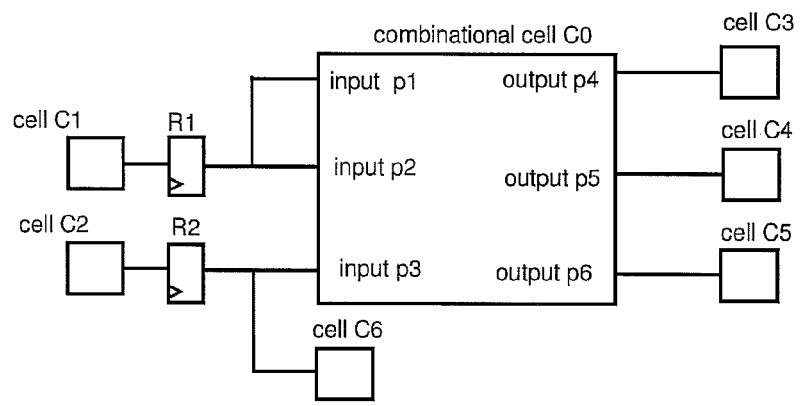
FIG. 8B (prior art)
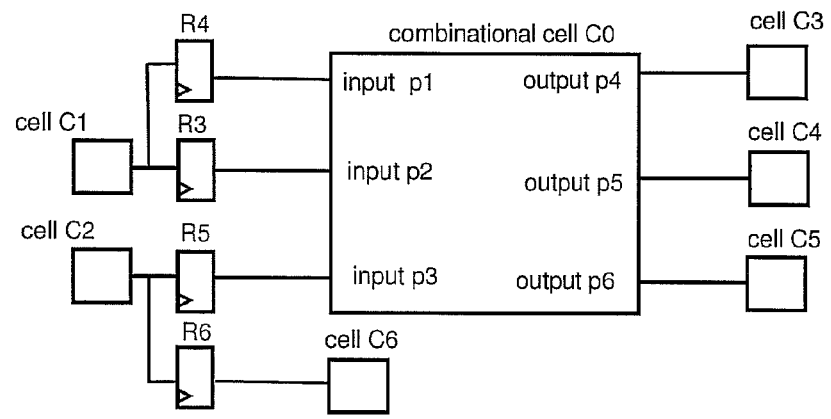
FIG. 8C
```
guide_retiming \
  -design { example } \
  -direction { forward } \
  -libCell { FM_FORK } \
  -input { :R1 } \
  -output { :R3 } \
  -output { :R4 }
guide_retiming \
  -design { example } \
  -direction { forward } \
  -libCell { FM_FORK } \
  -input { :R2 } \
  -output { :R5 } \
  -output { :R6 }
```

FIG. 8D
(prior art)
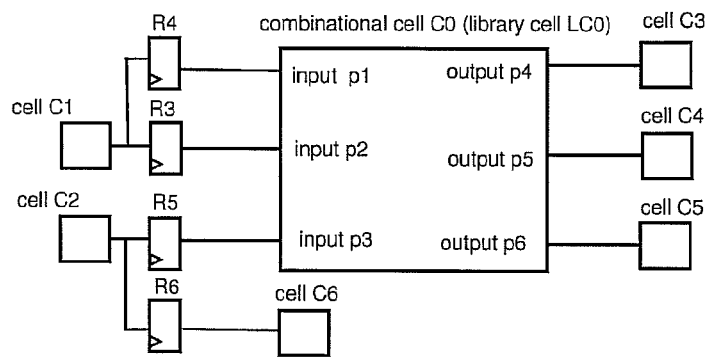
FIG. 8E
(prior art)
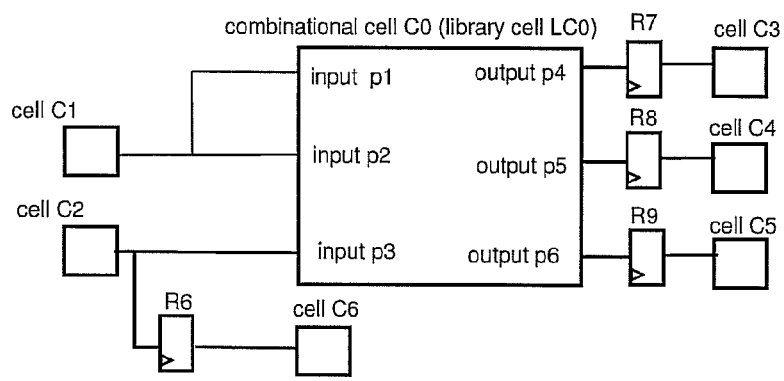
FIG. 8F
```
guide_retiming \
  -design { example } \
  -direction { forward } \
  -libCell { LC0 } \
  -input { p1:R4 } \
  -input { p2:R3 } \
  -input { p3:R5 } \
  -output { p4:R7 } \
  -output { p5:R8 } \
  -output { p6:R9 }
```

FIG. 8G (prior art)
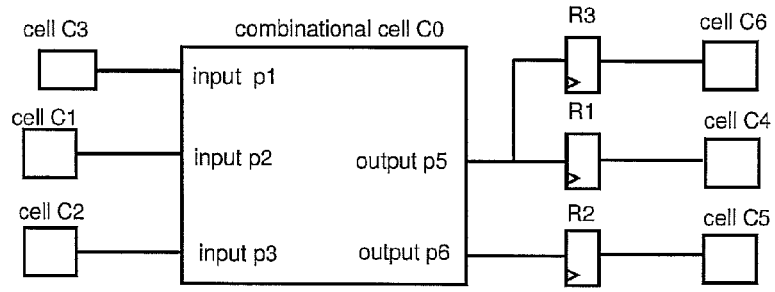
FIG. 8H (prior art)
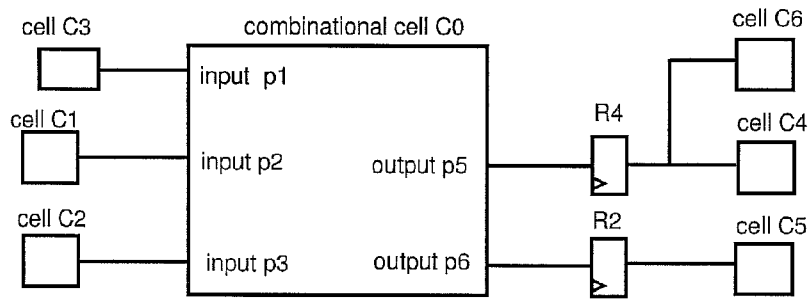
FIG. 8I
{
  guide_retiming \
  -design { example } \
  -direction { backward } \
  -libCell { FM_FORK } \
  -input { :R4 } \
  -output { :R1 } \
  -output { :R3 }
}

FIG. 8J
(prior art)
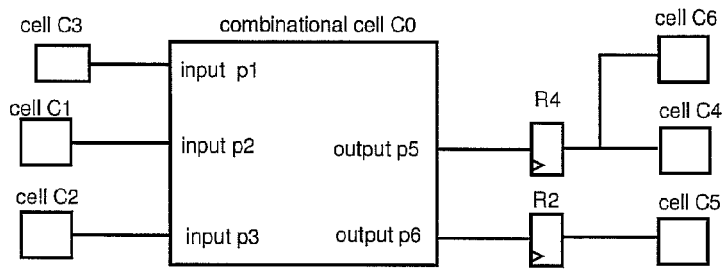
FIG. 8K
(prior art)
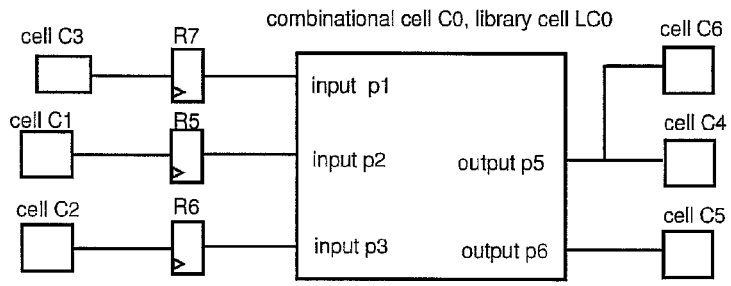
FIG. 8L
{
guide_retiming \
  -design { example } \
  -direction { backward } \
  -libCell { LC0 } \
  -input { p1:R7 } \
  -input { p2:R5 } \
  -input { p3:R6 } \
  -output { p5:R4 } \
  -output { p6:R2 }
}

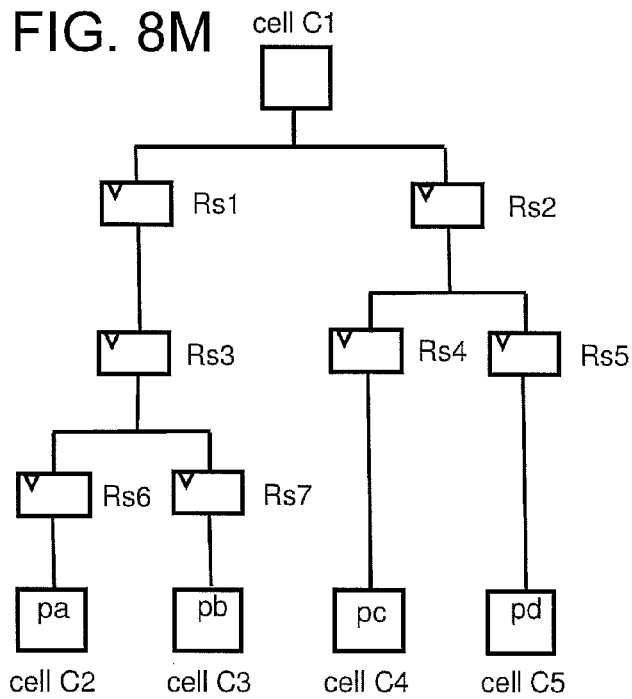
FIG. 8M
FIG. 8O
netlist after all main moves are done (Ns):
pa -> { Rs1, Rs3, Rs6 }
pb -> { Rs1, Rs3, Rs7 }
pc -> { Rs2, Rs4 }
pd -> { Rs2, Rs5 }
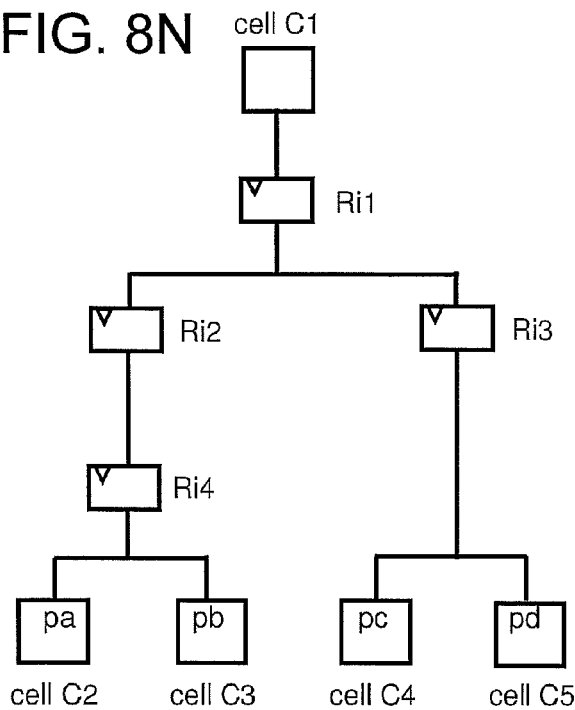
FIG. 8N
FIG. 8P
implementation design (final netlist) (Ni):
pa -> { Ri1, Ri2, Ri4 }
pb -> { Ri1, Ri2, Ri4 }
pc -> { Ri1, Ri3 }
pd -> { Ri1, Ri3 }

FIG. 8Q $$\begin{cases} \text{Ri1 -> \{ Rs1, Rs2 \}} \\ \text{Ri2 -> \{ Rs3 \}} \\ \text{Ri3 -> \{ Rs4, Rs5 \}} \\ \text{Ri4 -> \{ Rs6, Rs7 \}} \end{cases}$$

FIG. 8R

```
guide_retiming \
  -design { example } \
  -direction { backward } \
  -libCell { FM_FORK } \
  -input { :Ri1 } \
  -output { :Rs1 } \
  -output { :Rs2 }
```

FIG. 8S

```
guide_retiming \
  -design { example } \
  -direction { backward } \
  -libCell { FM_FORK } \
  -input { :Ri2 } \
  -output { :Rs3 }
```

FIG. 8T

```
guide_retiming \
  -design { example } \
  -direction { backward } \
  -libCell { FM_FORK } \
  -input { :Ri3 } \
  -output { :Rs4 } \
  -output { :Rs5 }
```

FIG. 10A

```
guide_retiming \
        -design {test} \
        -direction {forward} \
        -libCell {FM_FORK} \
        -input {:R1} \
        -output {:__tmp__name__1} \
        -output {:__tmp__name__2}
guide_retiming \
        -design {test} \
        -direction {forward} \
        -libCell {FM_FORK} \
        -input {:R2} \
        -output {:__tmp__name__3} \
        -output {:__tmp__name__4}
guide_retiming \
        -design {test} \
        -direction {forward} \
        -libCell {GTECH_NOT} \
        -input {A:__tmp__name__3} \
        -output {Z:__tmp__name__5}
guide_retiming \
        -design {test} \
        -direction {forward} \
        -libCell {GTECH_AND2} \
        -input {A:__tmp__name__2} \
        -input {B:__tmp__name__5} \
        -output {Z:X2}
guide_retiming \
        -design {test} \
        -direction {forward} \
        -libCell {FM_FORK} \
        -input {:__tmp__name__1} \
        -output {:X1}
guide_retiming \
        -design {test} \
        -direction {forward} \
        -libCell {FM_FORK} \
        -input {:__tmp__name__4} \
        -output {:X3}
guide_retiming_finished
```

```
⎧ guide_retiming \
⎪  -design { example } \
⎪  -boolean { Z = A xor (B and C) } \
⎨  -direction { forward } \
⎪  -input { A:R1 } \
⎪  -input { B:R2 } \
⎪  -input { C:R3 } \
⎩  -output { Z:X1 }
```

$\left\{\begin{array}{l}\text{guide\_retiming }\backslash \\ \text{ -design \{ example \} }\backslash \\ \text{ -boolean \{ FM\_FORK \} }\backslash \\ \text{ -direction \{ backward \} }\backslash \\ \text{ -input \{ :X1 \} }\backslash \\ \text{ -output \{ :R3 \} }\backslash \\ \text{ -output \{ :R2 \} }\backslash \\ \text{ -output \{ :R1 \}}\end{array}\right.$

TRANSFORMATION OF IC DESIGNS FOR FORMAL VERIFICATION

CROSS-REFERENCE TO PARENT APPLICATION

This application is a divisional application of U.S. patent application Ser. No. 11/495,136 entitled "TRANSFORMATION OF IC DESIGNS FOR FORMAL VERIFICATION" by Muzaffer Hiraoglu and Peter Wilhelm Josef Zepter, filed on Jul. 28, 2006. U.S. patent application Ser. No. 11/495,136 is incorporated by reference herein in its entirety, including Appendices A and B therein.

BACKGROUND

1. Field of the Invention

The invention relates to verification of a design of an integrated circuit (IC). More specifically, the invention relates to a method and an apparatus for formal verification of an IC design that has been retimed, by moving sequential cells across one or more cells of combinational logic.

2. Related Art

Formal verification is well known in the art. See, for example, U.S. Pat. No. 6,336,206 granted to Lockyear on Jan. 1, 2002 and U.S. Pat. No. 6,668,362 granted to McIlwain et al. on Dec. 23, 2003 both of which are incorporated by reference herein in their entirety, as background. Formal verification is normally performed by a computer that has been suitably programmed with software, such as "Formality" available from Synopsys, Inc. and "Conformal" available from Cadence Design Systems, Inc. Such tools are commonly used to check whether two versions of an IC design at different stages of implementation are functionally equivalent to one another. A first version of the IC design, which is known to be functionally correct, is referred to as a reference design. A second version of the IC design, which is verified against the reference, is referred to as an implementation design. The implementation design is typically a gate-level representation that is generated by a logic synthesis tool which receives as its input the first version which is a register transfer level (RTL) description normally represented using a hardware description language such as Verilog/VHDL. Examples of logic synthesis tools are "Design Compiler" available from Synopsys, and "RTLC" available from Cadence.

When the above-described two designs are read into a formal verification tool, they are both divided up into smaller components called logic cones. A logic cone is a set of combinational logic that is bounded by sequential cells (e.g. "registers"), input-output ports of the IC design (called "primary inputs/outputs"), or black boxes. The contents of a black box are not verified (and are typically not known), but signals at the input of the "black-box" are proven to be equivalent by the formal verification tool, while treating the black-box outputs as primary inputs of the IC design. Output pins of logic cones form compare points, which are to be shown as equivalent between the two designs.

After the two designs are read in, the formal verification tool determines which compare points between the reference and implementation designs correspond to each other. The functionality of each matched compare point is then proven or disproven to be equivalent. This is known in the prior art as combinational equivalence checking. During combinational equivalency checking, it is common for the formal verification tool to assume that a black box in the implementation design is same as its counterpart in the reference design. Note that compare point mismatches can occur if black boxes in the reference design do not match those found in the implementation design.

One type of optimization that may be performed by a logic synthesis tool is called "retiming". In performing retiming, sequential cells are shifted across combinational logic to transfer associated delay from a path with negative slack to a neighboring path with available slack. Moreover, sequential cells that are being moved may be merged or duplicated.

FIGS. 1A and 1B show examples of a gate-level IC design (respectively labeled G1 and G2) prior to and subsequent to forward retiming. FIGS. 1E and 1F show examples of the gate-level IC design (also labeled G1 and G2) prior to and subsequent to backward retiming. As shown in FIGS. 1B and 1F, retiming operations may change the number of sequential cells, and/or the size of logic cones in the two versions of the gate-level IC design. Other combinational optimizations (such as resynthesis) may further be done on the synthesized circuit G2 to result in the synthesized IC design labeled G4 respectively shown in FIGS. 1C and 1G in which the combinational logic within a given logic cone has changed. The just-described changes may result in compare points that are impossible to match between an IC design and its synthesized version(s).

A formal verification tool (such as Formality available from Synopsys, Inc.) performs its own elaboration of RTL design into a gate-level IC design. For example, FIG. 1D illustrates Formality's elaboration of RTL shown in FIG. 1A. In a similar fashion, FIG. 1H illustrates Formality's elaboration of RTL shown in FIG. 1E. Note that FIG. 1A and FIG. 1E are two example designs whereby their corresponding retimed designs shown in FIG. 1B and FIG. 1F illustrate retiming in forward and backward directions respectively. FIGS. 1C and 1G illustrate designs that are derived from the respective retimed designs in FIGS. 1B and 1F, e.g. after re-synthesis and/or clock gating to lower power consumption and/or scan structure insertion for testing, etc. Due to the structural differences between reference and implementation designs as shown in FIGS. 1C and 1D, and in FIGS. 1G and 1H, any combinational equivalency checking by a formal verification tool may not be meaningful.

Specifically, a synthesis tool (such as the above-described Design Compiler) may be used to synthesize a given RTL design into a gate level IC design G1 followed by retiming to generate IC design G2, followed by re-synthesis to generate IC design G3 (not shown in FIGS. 1A-1H) followed by further processing to generate IC design G4. Due to such operations, the number of sequential cells and their next state functions are usually different in netlist G4 (see FIGS. 1C and 1G) when compared to netlist F1 (see FIGS. 1D and 1H) and netlist G1 (see FIGS. 1C and 1G). The netlists F1 and G1 are equivalent and can be shown to be equivalent by a formal verification tool such as Formality available from Synopsys, Inc. The netlist G4 which is a retimed and resynthesized version of G1, on the other hand, cannot be shown to be equivalent to F1 by a combinational equivalency checking tool without additional processing. One such additional processing is described in a paper entitled "Peripheral Retiming Applied to Circuit Verification" by Brian Lockyear, Synopsys Inc, Advanced Technology Group, 19500 NW Gibbs Drive, Beaverton, Oreg. 97006, which is concurrently filed herewith and incorporated by reference herein in its entirety as background.

The netlists G4 and F1 are not combinationally equivalent. They are sequentially equivalent and can be shown to be equivalent by a sequential equivalency tool. Since retiming is one form of sequential optimization, sequential equivalency checking tools can be used to show the equivalence of retimed designs. Although such sequential equivalency checking tools exist, they are not scalable to practical circuit designs. One example of a sequential equivalency checking tool is SLEC sequential equivalence checking software available from Calypto Design Systems, 2933 Bunker Hill Lane, Suite 202, Santa Clara, Calif. 95054.

To the knowledge of the current inventors, prior art methods for equivalency checking of circuits optimized by retiming required structural similarity between the reference and the implementation designs in order to be able to reverse the effects of retiming optimizations and convert the retiming verification problem into combinational equivalence checking domain. One of these methods is described in an article entitled "REVERSE: Efficient Sequential Verification for Retiming" by Maher Mneimneh and Karem Sakallah, published in "International Workshop on Logic and Synthesis" 2003. This article recognizes the existence of a retiming invariant relating the two circuits, and utilizes that invariant in an induction-based verification paradigm.

SUMMARY

A memory of a computer in accordance with the invention is encoded with data that represents a reference IC design, a synthesized IC design that has been retimed, and logical relationships, wherein at least one logical relationship describes a specific relationship between a given set of sequential cells prior to retiming to a corresponding set of sequential cells after retiming. In several embodiments of the invention, such a logical relationship for retiming lacks instance-identifying information about one or more combinational cells which implement the relationship in the IC design(s). Specifically, a logical relationship that specifies retiming in some embodiments of the invention generically describes one or more cells of combinational logic relative to which sequential cells have been moved for retiming, e.g. by use of an identifier which, depending on the embodiment, identifies a library cell in a technology library or alternatively identifies a Boolean function performed by the combinational cell. The identifier in a logical relationship may have other forms in other embodiments.

The computer is further programmed to use a logical relationship (or a group of logical relationships that are chained to one another by common sequential cell names) to instantiate a set of combinational cells (also called "white" box), and to automatically define a black box as being functionally inverse of the set of combinational cell(s) just instantiated. Each pair of a white box and its functionally inverse black box may be conceptually thought of as a null operation (also called "no-op"). For this reason each white box and its black box may be together added to any IC design without affecting functionality.

The computer is also programmed to add each pair of white box (i.e. set of combinational cells) and its functionally inverse black box to the reference IC design which eventually results in a transformed reference IC design. In one embodiment, the reference IC design is transformed by replacing one or more sequential cells therein with a circuit of interconnected sequential cells and combinational cells (together called "replacement circuit") which includes the just-described white box, its functionally inverse black box, and copies of the just-described one or more sequential cells (in the form of sequential cells). In this embodiment no actual movement of sequential cells (i.e. sequential cells) is required, because the copies are pre-arranged in the replacement circuit, to be in an appropriate location relative to the white box and the black box.

Replacement of the sequential cells in the reference IC design with the replacement circuit makes it easy to effectively implement retiming move(s) across combinational cells, because the combinational cells are added (as a white box) and hence no structural match is necessary (relative to any other IC design). The computer is also programmed to obtain a transformed retimed IC design by addition of white box(es) and functionally inverse black box(es) to the retimed IC design (which may be added as another replacement circuit). These two transformed IC designs are then supplied to a combinational equivalence checker, for formal verification in the normal manner. The specific algorithms which are used in equivalence checking of the transformed IC designs are not critical aspects of the invention.

BRIEF DESCRIPTION OF THE DRAWINGS

FIGS. 4A and 6A illustrate, in ASCII text, logical relationships of the type included in setup information file 210 in some embodiments of the invention, to document movement of a sequential cell across an AND gate in the forward and reverse directions, in an IC design for an "ALU".

FIGS. 4B and 4C illustrate two conceptual combinations (also called "null-effect logic") of a white box and black box (of FIGS. 3B and 3C) based on the logical relationship described in FIG. 4A.

FIGS. 4D and 4F illustrate the IC designs of FIGS. 1C and 1D after addition thereto of the combinations of FIGS. 4B and 4C respectively.

FIG. 4E illustrates a result of conceptually moving sequential cells R1 and R2 shown in FIG. 4D across the newly-added cell instance which result in sequential cell X1.

FIGS. 6D and 6E illustrate the transformed IC designs after use of the combinations of FIGS. 6B and 6C to transform IC designs given in FIG. 1H and FIG. 1G respectively, in some embodiments of the invention.

FIGS. 7A and 7B (for forward direction) and 7D and 7E (for backward direction) illustrate multiple logical relationships that are chained to one another in some embodiments of the invention.

FIG. 7C (for forward direction) and FIG. 7F (for backward direction) respectively illustrate in a block diagram, a combination of two cell instances created in some embodiments of the invention, based on the logical relationships of FIGS. 7A and 7B (for forward direction) and 7D and 7E (for backward direction).

FIGS. 8A, 8B and 8C illustrate the IC designs before and after retiming and an associated logical relationship of some embodiments wherein two sequential cells R1 and R2 (FIG. 8A) are split into sequential cells R4, R3 and R5, R6 respectively (FIG. 8B).

FIGS. 8G-8I are similar to FIGS. 8A-8C except that sequential cells R3 and R1 (in FIG. 8G) are merged into R4 (in FIG. 8H).

FIGS. 8D and 8E (for forward move) and 8J and 8K (for backward move) illustrate an IC design before and after a retiming move while 8F and 8L illustrate an ASCII representation of the move itself.

FIG. 8M illustrates an IC design after applying the retiming moves of the type shown in FIG. 2 as being included in file 210.

FIG. 8N illustrates the same IC design of FIG. 8M, at the end of the retiming method where sequential cell merging in addition to retiming moves across cells has been performed.

FIGS. 8O and 8P illustrate in ASCII text, tables derived from the netlists of FIGS. 8M and 8N respectively.

FIG. 8Q illustrates cell-to-cell matching to create sequential cell-to-sequential cell correspondences from the tables of FIGS. 8O and 8P.

FIGS. 8R, 8S and 8T illustrate three logical relationships, in ASCII text, which represent the results of cell-to-cell matching in FIG. 8Q. Note that a fourth relationship (not shown) completes the alignment (Ri4 forward to Rs6 and Rs7). Alignment refers to the process of finding logical relationships between FIGS. 8M and 8N, for output to file 210

FIG. 10A illustrates a set of atomic retiming moves in an example file 210.

DETAILED DESCRIPTION

Figure 1A:
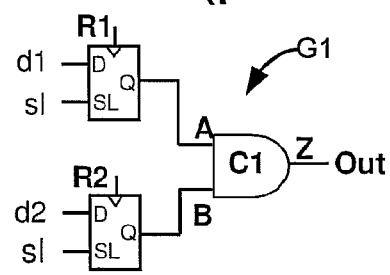
FIGS. 1A-1H illustrate prior art gate-level IC designs before and after (forward or backward) retiming and re-synthesis operations.
Figure 1B:
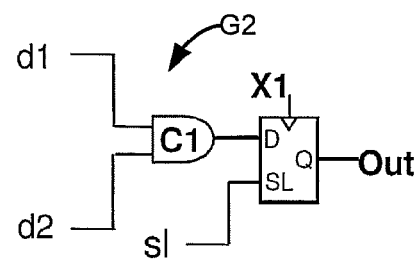

A 'netlist' is a representation of an electronic circuit used to perform optimizations. A netlist consists of cells and nets. A netlist can have a name for identification. The netlist name can also be referred to as the design name. A 'net' represents the connection on which electrical signals travel between cells. A 'cell' represents an electronic device that performs a certain function. A cell has a name for identification. A 'library cell' is a description of the properties of identical cells instantiated in a netlist of an electronic circuit. The description includes the pins of the cells and the pin names as well the functional relationship (i.e. the output pin values as a function of the signal values at the input pins) between the pins, e.g. specified as a method to compute the signal values at the output pins given the signal values at the input pins). Optionally the description may include physical information for the cells such as delay information, area or floorplan information.

Each cell in an IC design corresponds to one specific library cell. A cell library is a collection of library cells. A cell library that does not contain physical information is a generic cell library. The GTECH library used by Synopsys Design Compiler is an example of a generic library. A cell library that does contain physical information is a technology library. Technology libraries are typically provided by manufacturers of electronic circuits. The lsi_10k library provided together with Synopsys Design Compiler is a example for a technology library.

In the following description, a 'pin' is the part of a cell at which it connects to a net. A pin has one of the following three directions: in, out, inout. A pin of direction "in" (also referred to as input pin) is a pin through which a signal enters a cell. A pin of direction "out" is a pin through which a signal leaves a cell. Pins of direction "inout" can have signals traveling both ways.

Cells can be classified in several categories: (1) a primary input is a cell which receives inputs external to the netlist; a primary input has no input pin and at least one output pin, (2) a primary output is a cell which transmits signals to the outside of the netlist; a primary output has no output pin and at least one input pin, (3) a combinational cell has no internal state and computes its output signals only from its input signals; a combinational cell has at least one input pin and one output pin. A "constant cell" is a cell which has only one value that does not change while the circuit is operating. The value is either 0 or 1. A constant cell has only one output pin and no input pins. A net connected to a constant cell is called a constant net and has the same value as the cell. A cell that connects to a net with an output or inout pin is called a driver of the net. The pin is called a driver pin of the net. A cell that connects to a net with an input or inout pin is called a load of the net. The pin is called a load pin of the net.

A 'sequential cell' has an internal state which can only change, when one or more specific input pins of the cell, called clock pins, have a signal with a specified value or value transition (hence the internal state is either edge triggered or level sensitive). Edge triggered sequential cells are often referred to as registers or flip-flops and level sensitive sequential cells are referred to as latches. For the following description, sequential cells have the following pins: one or more clock pin(s) (which are input pins) as defined earlier; one next-state pin (which is an input pin), wherein the signal value of the net connected to the next-state pin becomes the value of the internal state whenever the clock signal(s) have the values or transitions allowing a state change and the control inputs do not specify otherwise; optional control pins (also input pins) wherein control pins can specify that the value different from that at the next-state pin becomes the new internal state of the sequential cell or that the current internal state is not changed despite the appropriate clock signals; and one output pin, which provides the value of the internal state to the net connected to it. Sequential cells that have pins different from those described here can usually be transformed to sequential cells that meet these requirements with additional combinational logic.

As used in the following description, 'retiming' is an optimization technique for digital electronic circuits. Retiming changes the sequential cells of the netlist to improve performance or cost without changing the function of the circuit as seen from the outside. Retiming is specified by a sequence of retiming moves which when performed on a reference design implement one or more logical relationships of the type described next.

A state of a netlist (electronic) circuit is an assignment of logic values (usually 0 and 1) to all the sequential cells in the netlist. A logical relationship (as used in this detailed description of the invention) describes how to compute corresponding states in the retimed design and the reference design. Specifically for the sequential cells that are retimed forward, the logical relation ship enables a computer to compute the values for the sequential cells in the retimed design given the values for sequential cells in the reference design. For the sequential cells that moved backward the values for the sequential cells in the reference design can be computed given the values for the sequential cells in the retimed design. Unmoved sequential cells have the same value in both designs for corresponding states.

Figure 2:
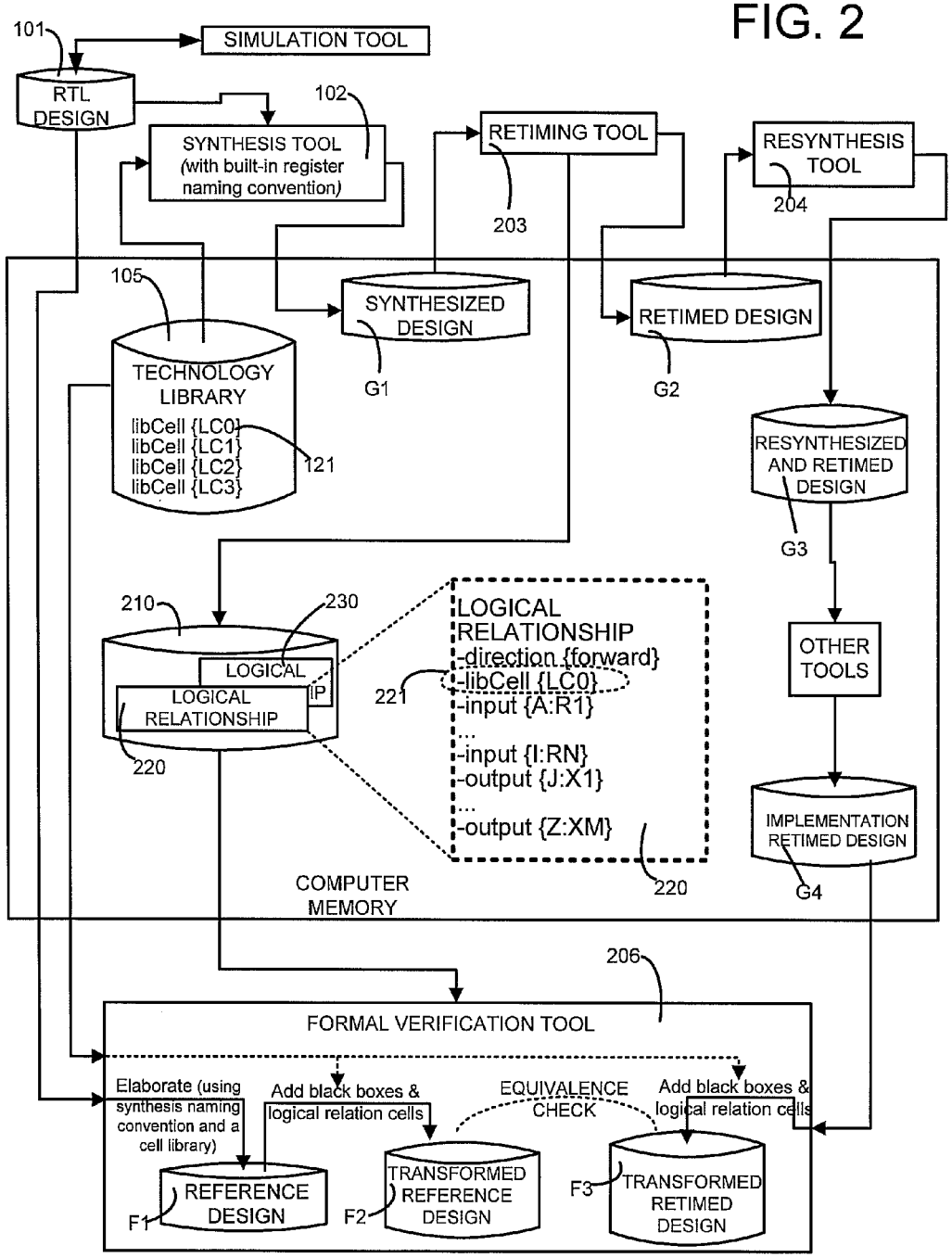
FIG. 2 illustrates, in data flow diagram in accordance with the invention, generation of setup information in file 210 and usage of this information in formal verification tool 206.

A memory of a computer (see FIG. 9A) in accordance with the invention is encoded with data that represents a reference IC design F1 (FIG. 2) and at least one retimed IC design G4 (FIG. 2) which is elaborated from a common RTL design 101. FIG. 2 illustrates logical relationships (in a file 210) to be used to transform an internally-elaborated IC design F1 and to transform any synthesized IC design G2, G3 or G4 (which are not retimed relative to one another but are all retimed relative to G1) prior to combinational equivalence checking in the normal manner.

Specifically, IC design F1 and IC design G1 are both elaborated from common RTL design 101 by independent elaboration mechanisms, typically present in two separate and distinct EDA tools, such as a synthesis tool 102 and a formal verification tool 206. IC design F1 and IC design G1 are both gate-level designs. Design G1 is obtained in some embodiments after optimization and after cells are instantiated from a specific technology library, whereas design F1 may or may not be technology dependent. Specifically, depending on the embodiment, design F1 may contain instantiations of cells from a generic cell library such as the GTECH library, or alternatively design F1 may contain instantiations of cells from a technology library which can be same as (or alternatively different from) a specific technology library used in design G1.

Depending on the embodiment, F1 may be compared with any of retimed designs G2 or G3 or G4. In some instances, operations in between G2-G3 and G3-G4 may not change G2 and/or G3. In such instances, G2=G3=G4. In several embodiments, F1 is compared directly with G4 (i.e. not compared with G2 or G3), regardless of changes from G2 to G3 and from G3 to G4 (assuming no retiming between G2 and G4).

Comparison of F1 to G4 is useful in embodiments wherein G2 and G3 are not readily accessible by users of the synthesis tool (e.g. if they are internal to the synthesis tool). As designs G1-G4 refer to technology library cells, the technology library is typically needed to check equivalence of gate level designs F1 and one of designs G2/G3/G4. In accordance with the invention, each of these two tools 102 and 206 use a common sequential cell naming mechanism during such elaboration, and for this reason sequential cells that are identically named in the two designs F1 and G1. Note that in several embodiments, the same identical names are also used in logical relationships in file 210, so that tool 206 can transform design F1 into a transformed design F2 (which is input to the combinational equivalence checking tool).

Note that certain embodiments require G4 to have subdesign hierarchy same as the reference design F1 although other embodiments do not impose this restriction. In the certain embodiments which impose this restriction, ungrouping of retimed design is not allowed. For example, a top level design CPU (central processing unit) has a sub-design named "ALU" (for arithmetic logic unit) in it. Assume that only the ALU is retimed. Some embodiments require that G4 keep the "ALU" instance as a subblock in the hierarchical design of the CPU block. However, as will be apparent to the skilled artisan, the invention is applicable to other tools which do not have this limitation, in other embodiments, e.g. if names of subblocks in the design (and optionally names of blocks in the design) are embedded within sequential cell names.

A synthesis tool 102 (e.g. included in software called "Design Compiler" available from Synopsys, Inc.) that is executed by a computer programmed in accordance with the invention uses a built-in sequential cell naming convention, and hence a formal verification tool 206 (such as Formality also available from Synopsys, Inc.) is programmed in accordance with the invention to also use that same (synthesis) naming convention for sequential cells. IC design G2 is typically created by a retiming tool 203 (e.g. also included in the software called "Design Compiler") executed by such a computer from synthesized IC design G1 in the normal manner (by use of prior art retiming algorithms), although retiming tool 203 differs from prior art retiming tools by further programming to emit logical relationships in setup information file 210 which have been genericized as described herein. IC design G3 is typically created by a resynthesis tool 204 (e.g. also included in the software called "Design Compiler") executed by such a computer from synthesized IC design G2, in the normal manner.

Specifically, a computer in accordance with the invention abstracts away any information that uniquely identifies instances of logic cells, e.g. specific logic cells which are present in synthesized design G1. Hence, instead of referring to specific logic instances (such as "syn_AND21_39055") which may be present in the IC design G1, logical relationships in accordance with the invention use identifiers that are normalized, such as a Boolean function being performed by the combinational logic instance(s) across which movement of sequential cell(s) is performed. Examples of Boolean function-based identifiers that are used in logical relationships in some embodiments of the invention are AND, OR, XOR. Note that such an identifier may have other forms in other embodiments.

As another example, instead of identifying Boolean functions, some embodiments of the invention express logical relationships in file 210 (FIG. 2) by use of identifiers of library cells of a technology library which implement the corresponding Boolean functions (and still abstract away any instance-specific information present in the IC design G1). In the exemplary embodiment of the invention shown in FIG. 2, a logical relationship 220 in the form of a "retiming move" identifies a library cell 121 in a technology library 105 by use of an identifier 221. Hence, cell 121 and identifier 221 both use the same cell name LC0, and for this reason identifier 221 when expressed in ASCII by the computer is represented as the string "libCell {LC0}." Due to abstraction which removes instance-specific information, any number of other logical relationships (such as logical relationship 230) in accordance with the invention may contain the very same identifier 221, as long as the respective cells in G1 were instantiated from same library cell. Note that some alternative embodiments may express such logical relationships in the form of, for example, binary decision diagrams (BDDs) while other embodiments may use lookup tables.

Hence, regardless of a specific instance name such as "syn_AND21_39055" and "syn_AND21_39056" both these instances are normalized for expression in logical relationships 220 being emitted, by use of a common identifier 221 in each of moves 220 and 230. In this embodiment of FIG. 2, setup information in file 210 (e.g. logical relationship) is present in a binary form that is known to both tools 203 and 206, although other forms and formats may be used in other embodiments (e.g. expressed in text or in an eXtensible Markup Language, i.e. "XML" or other such markup language in conformance with SGML which is available from W3C).

The computer is further programmed in accordance with the invention to use such logical relationship(s) from file 210 to instantiate logic gate(s) described therein. Specifically, a logical relationship 220 (e.g. in the form of a retiming move) is used to create an instance of library cell 121 (see FIG. 3B) from technology library 105, by use of identifier 221. For example an instance fv_AND_2 is created from library cell 121 which is called libCell LC0 in technology library 105 (see FIG. 2). The newly-created instance is also referred to herein as a move-based cell. One illustrative embodiment collects a number of such move-based cells into a white box which is eventually subdivided into smaller white boxes. The computer is further programmed to automatically define a black box (see FIG. 3C) as being functionally inverse of each smaller white box. Note that a functional inverse is not simply obtained by adding an inverter to the combinational logic in a smaller white box, and instead the inputs and outputs are switched as discussed next.

For example, the functional inverse of an AND gate is a black box which has a single input pin and two output pins and supplies at its output pins the signals which are received at input pins of the AND gate. The black box receives at its input pin a signal that is output by the AND gate. The word "inverse" is used herein to denote such reversal of signals by a black box, relative to corresponding signals of the combinational logic from which it is defined (whereby, due to reversal, inputs are made outputs and vice versa). Note that automatically created black boxes of the type described herein (which are inverse of the combinational logic) are not required by the invention to be realizable in physical form, because of their primary use as place holders, e.g. to find compare points for combinational equivalence checking Each pair of a newly-instantiated combinational logic and its functionally inverse black box together form logic which has a null effect (e.g. like a "no-op" operator) on any IC design to which they are added. The computer is further programmed in accordance with the invention to add (as per act 308 in FIG. 3A) such null-effect logic (of instantiated logic and its functionally inverse black box) to reference IC design F1 for each group of logical relationships 220 (FIG. 2) in file 210 received from retiming tool 203 and to effectively implement the logical relationships on design F1, to obtain a transformed reference design F2. The computer is also programmed in accordance with the invention to further add (as per act 308 in FIG. 3A) another null-effect logic (of instantiated logic and its functionally inverse black box) to retimed IC design G4 to obtain a transformed retimed design F3. For convenience, the reference numeral G4 is hereinafter used to designate the retimed IC design being used in combinational equivalence checking, although it is to be understood that the following description is equally applicable to a corresponding use of G2 or G3.

Addition of null-effect logic does not functionally change the reference IC design F1 and also does not functionally change the retimed IC design G4. Presence of instantiated logic (within the null-effect logic) makes it easy for the computer to transform the reference design F1 into F2 and to transform the retimed design G4 into F3 which are now comparable by a combinational equivalency checking tool. Hence no structural similarity is required between reference design F1 and retimed design G4 to reverse the retiming moves. Specifically, after addition of the null-effect logic, the logical relationships can be implemented on reference design F1 regardless of the structure of the two IC designs, and as discussed below is performed in some embodiments directly on the null-effect logic before its addition to the reference IC design F1. Note that a transformed IC design F3 is obtained by addition of null-effect logic(s) to the retimed IC design G4 in a similar fashion, to generate the two transformed designs F2 and F3 which are comparable by a Formal Verification Tool.

The two transformed IC designs F2 and F3 now contain matching compare points due to the above-described transformation. The computer supplies the transformed designs F2 and F3 (as per act 309 in FIG. 3A) to a combinational equivalence checker for formal verification. The computer then uses the black boxes in the two IC designs in the manner normally used by any combinational equivalence checking tool, although here the black boxes have been automatically inserted to enhance comparison. Specifically, the computer uses black box outputs as primary inputs during combinational equivalence checking, and further uses black box inputs as primary outputs. In several illustrative embodiments, a combinational equivalence checking tool (such as Formality available from Synopsys) verifies the output functions up to black-box outputs, and further verifies the matching sequential cells up to the primary inputs. Note that specific algorithms which are used in performing combinational equivalence checking are not critical aspects of the invention.

Figure 3A:
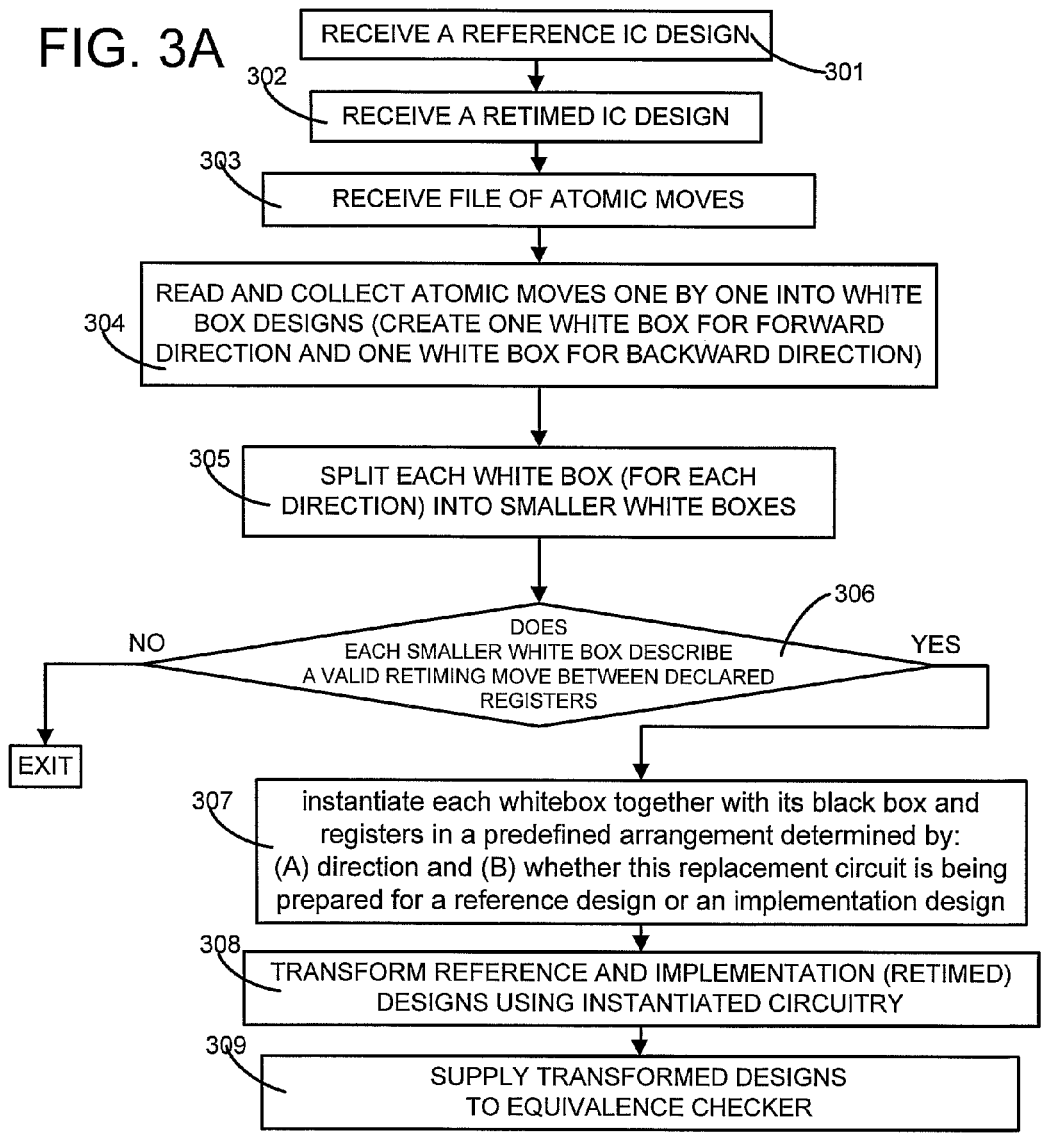
FIG. 3A illustrates, in a flow chart, a method for transforming an internally-elaborated IC design and a retimed IC design by use of the logical relationships of FIG. 2, which are expressed in a file of atomic retiming moves in some embodiments of the invention.

Referring to FIG. 3A, a computer is programmed with software (called "IC design transformer") to perform acts 301-309 which may be implemented either in a standalone tool 999 (see FIG. 9B) or within a formal verification tool 206 (such as Formality available from Synopsys, Inc.), depending on the embodiment. In acts 301 and 302, two designs to be compared are received, and typically one is a reference IC design F1 which has been independently elaborated from a given RTL design 101 and the other is an implementation retimed design G4 which has been obtained after retiming (and any other operations) on a synthesized design G1 also elaborated from the same given RTL design 101.

Next in act 303 the computer receives a file 210 containing logical relationships, which in the embodiments illustrated in FIG. 3A describe moves of retiming done on a design G1 to obtain design G2. Each move identifies a single combinational cell (in generic form) across which retiming requires movement of sequential cell(s), and for this reason each move is also referred to as an "atomic" move. In act 304, a file 210 containing the logical relationships received in act 303 is read and atomic moves are collected one by one into two groups, namely one group to form an initial "white box" of retiming moves in the forward direction and another group to form another initial "white box" of retiming moves in the backward direction. In some embodiments, as the group of moves is read, a white box is progressively extended, to accumulate the information being read about each move, eventually resulting in a large white box. Next, in act 305, the computer splits each group of retiming moves (in each initial white box, in each direction), into smaller non-overlapping groups (i.e. smaller "white boxes").

In one illustrative embodiment, moves read from file 210 are held by a formal verification tool in data structures similar to those used by the tool for storing a netlist in memory, e.g. in data structures similar or identical to those used to store a design (e.g. reference design F1) in memory. Note that in the illustrative embodiment, register normalization (also called register simplification) is performed at this stage, before checking for validity of retiming moves read from file 210.

Thereafter, in act 306, the computer checks if each smaller white box obtained in act 305 describes a valid retiming move between declared sequential cells. If the answer is no, then the program is terminated for receiving unusable data in file 210. A valid retiming move is described as all sequential cells in a given smaller "white box" belonging to the same class of sequential cells. Sequential cells that belong to the same sequential cell class have equivalent control pins, such as synchronous enable (see pin SL in FIGS. 1A-1H), asynchronous load, and clock, so that they change values in exactly the same moment in time. For example, two sequential cells driven by the same clock but having two independent synchronous enable signals do not belong to the same sequential cell class and therefore cannot be involved in a given retiming move. Since each smaller white box represents a relationship between a group of sequential cells before retiming and a group of sequential cells after retiming, all involved sequential cells should belong to the same sequential cell class. In certain cases sequential cell classes might look different, but a simple decomposition operation might bring them into the same class. In such cases (not shown in FIG. 3A), the computer does not just exit if the answer is "no" but attempts to bring them into the same class by decomposition and if the decomposition is successful the computer continues as if the answer was a "yes". For more information, see an article entitled "A Practical Approach to Multiple-Class Retiming" by Klaus Eckl et al, published at Design Automation Conference (DAC), 1999 New Orleans, La., which is hereby incorporated by reference herein its entirety.

In act 306 if the answer is yes, then the computer goes to act 307 to instantiate each smaller white box (FIG. 3B) and also defines its black box (FIG. 3C), and further instantiates sequential cells whose names are specified in the smaller white box to create the replacement circuits. The instantiations of act 307 are performed twice, e.g. to create two replacement circuits using predefined arrangements, i.e. one circuit for reference design and another circuit for retimed design. Note that the specific arrangement being used also depends on the direction (forward or backward) of the moves.

Next, in act 308, the computer replaces the sequential cells (in general a group of sequential cells) in the respective designs with their corresponding replacement circuits. Then, in act 309, the computer supplies the two transformed designs to the equivalence checker. Note that in some embodiments, moves for both directions cause changes to the reference design and to the retimed design. In such embodiments, for forward moves, a white box and its black box (arranged in this first arrangement relative to one another) is added to the reference design and a black-box and its white box (arranged in this second arrangement relative to one another) is added to the retimed design (whereas for backward moves the reverse is true). Depending on the embodiment, the sequential cells that are included in the replacement circuit are placed relative to the white box and to the black box, in any patterns (such as WRB and RBW shown in FIGS. 5A, 5B, 6B and 6C) as discussed below, e.g. in paragraph [00169] et seq. Alternatively, null logic may be itself inserted (e.g. in the form of white box and black box combination), and thereafter the preexisting sequential cells moved relative to one or both of the inserted boxes. Use of null logic is described in an article entitled "Metamorphosis: state assignment by retiming and re-encoding" published in Proceedings of the 1996 IEEE/ACM International Conference on Computer-Aided Design San Jose, Calif., United States, Pages: 614-617 which is incorporated by reference herein in its entirety.

Some embodiments of the method illustrated in FIG. 3A, perform a register simplification step that simplifies sequential cell class checking but such a step can be done in anyway one chooses or even not performed, depending on the embodiment. In certain embodiments, signals that set and clear a sequential cell are replaced with corresponding data signals to load a value of "1" or "0" into the sequential cell. Accordingly, several embodiments eliminate the following four signals: synchronous-clear, asynchronous-clear, synchronous-set and asynchronous-set, because the data signal is used instead, as just noted above. The register simplification step is done in these several embodiments between acts 305 and 306. Move validation is done in these embodiments after such register simplification, as described above in reference to act 306 (see paragraph [0069]). Specifically, as noted above, all sequential cells that have the same clock, synchronous enable and asynchronous enable are determined to be in the same class.

In some embodiments, splitting criteria that is used in act 305 is non-overlapping parts or in other words connected component analysis. In performing connected component analysis, the computer automatically identifies every circuit element that is connected to a common net (e.g. connected to same pin or connected to same gate). Note that if a cell is connected to another cell via a net these cells and the net, belong to the same connected component. Anything connected to those is included in the same component, and the component grows. Connected component analysis is performed in some embodiments by an appropriately programmed computer as follows: (1) start from an output port of the initial large whitebox; (2) add the port to a first component-part-list, label this component-part-list with the port pointer or port name; (3) traverse the design from the port towards the inputs; (4) anything on the traversal path belongs the component, add them to the component-part-list; (5) go to another port, assume the port belongs to a new component. create a new component-part-list and label it with the port name (or pointer); (6) traverse the design from the port towards the inputs; (7) anything on the traversal path belongs to the new component but if a part that is already put in another component-part-list is encountered then merge the two component-part-lists into one; and (8) goto act (5) until no more ports.

At the end the programmed computer has as many component-part-lists as the number of overlapping parts. Next, the computer creates smaller white boxes from the parts in each component-part-list. Depending on the embodiment, the computer may be programmed to use a hash table that links each part to a label (port names or port pointers) instead of part lists. During the first traversal everything encountered is entered into the hash table with its label. During the second traversal everything encountered is entered into the hash table with its label but if it is already in the hash table with another label, then all parts with that another label are changed to the new label (i.e. merging of the two lists above). The computer continues, until all parts are labeled. The number of different labels in the hash table indicates number of non-overlapping components. Then the computer creates smaller white boxes from the parts that have the same label in the hash table, as discussed next.

In act 305, components that are found to be connected are automatically placed into one small white box, thereby splitting the large white box into smaller disjoint white boxes. In some embodiments, an-input (or-output) declaration in file 210 has a format such that two values are separated by a ":". The first value is the pin name of the libCell. The second value is the sequential cell name. It might be a sequential cell name before retiming or a sequential cell name after retiming or a temporary name, depending on the embodiment. The port names of the white box are given names same as the sequential cell names so the computer knows which sequential cells are related. If a sequential cell is not mentioned in file 210, it means that sequential cell did not go through retiming so no action is necessary.

Figure 3B:
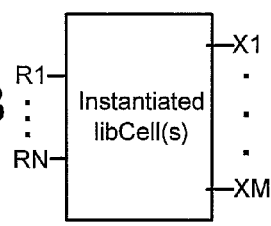
FIGS. 3B and 3C illustrate in block diagrams a white box cell instance and a black box respectively, that are added to the IC designs as illustrated in FIG. 3A in some embodiments of the invention.
Figure 3C:
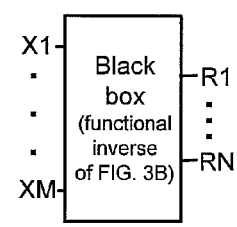

The above-described white box and black box of FIGS. 3B and 3C are illustrated in combination in greater detail in FIGS. 4B and 4C (which provide two variants thereof) for an exemplary logical relationship shown in FIG. 4A. In the logical relationship of FIG. 4A, note that the combinational logic across which sequential cells are moved (only conceptually in some embodiments) is identified simply as a Boolean function "AND", and based on the number of inputs specified therein, a corresponding gate 401 is instantiated from technology library 105, by using signals R1 and R2 as its inputs (see FIGS. 4B and 4C). Note that the Boolean function description identifies the input and output parameters of the function, so as to describe which sequential cell is associated with which variable in the Boolean function. Gate 401 has as its single output the signal X1, which is also shown in FIGS. 4B and 4C. Note that in null-effect logic formed by the combination shown in FIG. 4B, AND gate 401 is located upstream of black box 402 whereas the opposite configuration is shown in FIG. 4C.

Note that the way the logical relationship is described above is just one embodiment and numerous other embodiments will be apparent in view of this disclosure. One embodiment describes the logic relation of each atomic move and then a formal verification tool (e.g. Formality) combines atomic moves into a more complex group relationship between a group of sequential cells before retiming and a group of sequential cells after retiming. That complex relationship has been captured above by use of the small white boxes. In certain alternative embodiments, the retiming tool provides a full group relationship (in some form) in file 210 of FIG. 2. For example, a file 210 in one alternative embodiment describes a more complex relationship between sequential cells before and after retiming, as shown by the following relationship between input signal X1 and output signals R1 and R2: X1=R1 AND R2 AND R3.

In both configurations (see FIGS. 4B and 4C), black box 402 supplies signals R1 and R2 as outputs while receiving as input the signal X1. As will be apparent to the skilled artisan, black box 402 cannot be realized physically, because when signal X1 is 0, then it is not known as to whether signal R1 is 0 or signal R2 is 0 or both signals are 0. Due to lack of this knowledge, item 402 cannot be physically built and is referred to as a black box, although it is known to be functional inverse of AND gate 401. Note that a box 403 which contains the newly-instantiated combinational logic (i.e. AND gate 401) is referred to as a "white box" because its structural contents are known.

The white box and black box combination 405 in FIG. 4B has two inputs namely signals R1 and R2, and it also has the same signals R1 and R2 as its outputs. This combination 405 is added to reference design F1 (either conceptually or actually depending on the embodiment) by splicing the combination 405 between the outputs of sequential cells R1 and R2 and the corresponding inputs of inverters I1 and I2 (see FIG. 1D). A modified reference design FIG. 4D depicts FIG. 4B's placement in FIG. 1D as 405. The sequential cells R1 and R2 in FIG. 4D when moved across AND gate 401 result in the transformed reference design shown in FIG. 4E. While in some embodiments these two sequential cells are physically moved after insertion of logic 405, in other embodiments a sequential cell is inserted between white box 403 and black box 402 to obtain a circuit 501 (see FIG. 5A) which is then used to replace the two sequential cells in FIG. 1D to obtain FIG. 4E directly.

Figures 5A, 5B:
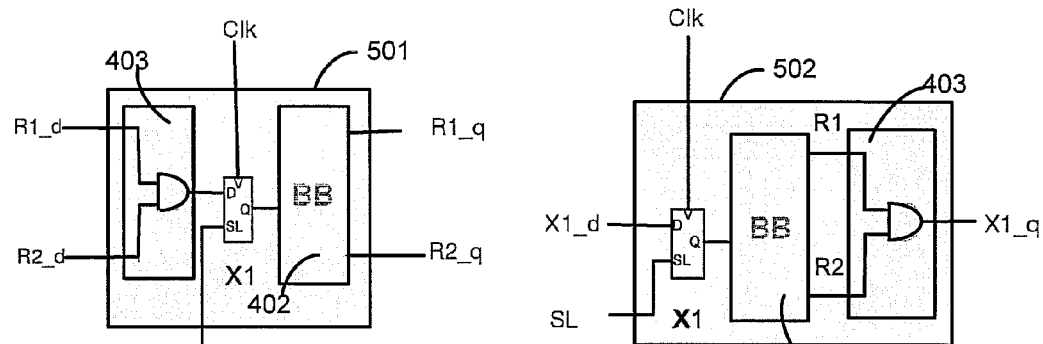
FIGS. 5A and 5B (for forward move) and 6B and 6C (for backward move) illustrate in block diagrams, an optimization implemented in many embodiments by inclusion of a sequential cell in the combinations of FIGS. 4A and 4B, prior to addition to the IC designs, thereby to eliminate the step illustrated by the transition from FIG. 4D to FIG. 4E.
Figure 5C:
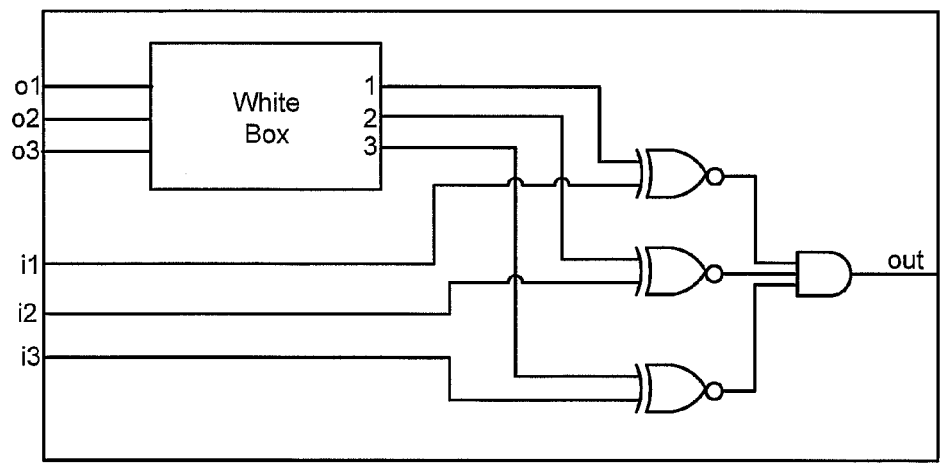
FIG. 5C illustrates use of a constraint to enforce functional behavior of a black box when evaluating the results of combinational equivalence checking in some embodiments of the invention.

Note that the circuit in FIG. 5A is sometimes referred to herein as a "forward replacement circuit for reference design" and the circuit in FIG. 5B is referred to as a "forward replacement circuit for implementation design". Similarly, the circuit in FIG. 6B is referred to as a "backward replacement circuit for reference design" and in FIG. 6C is referred to as a "backward replacement circuit for implementation design".

Note further that the circuit shown in FIG. 4D is an illustration of certain alternative embodiments that do in fact generate this circuit (FIG. 4D). Most embodiments directly generate the circuit shown in FIG. 4E. Hence, no movement is in fact performed in several embodiments which directly generate the circuit in FIG. 4E (i.e. without generating the circuit in FIG. 4D).

Another black box and white box combination 406 shown in FIG. 4C has a single input namely signal X1 and it also has the same signal X1 as its output. This combination 406 is added to retimed design G4 (FIG. 1C), at the output pin of sequential cell X1. After the FIG. 4C's combination 406 is added, the transformed retimed design is shown in FIG. 4F. The transformed reference design in FIG. 4E and the transformed retimed design in FIG. 4F are thereafter supplied to a combinational equivalence checker.

Figure 4G:
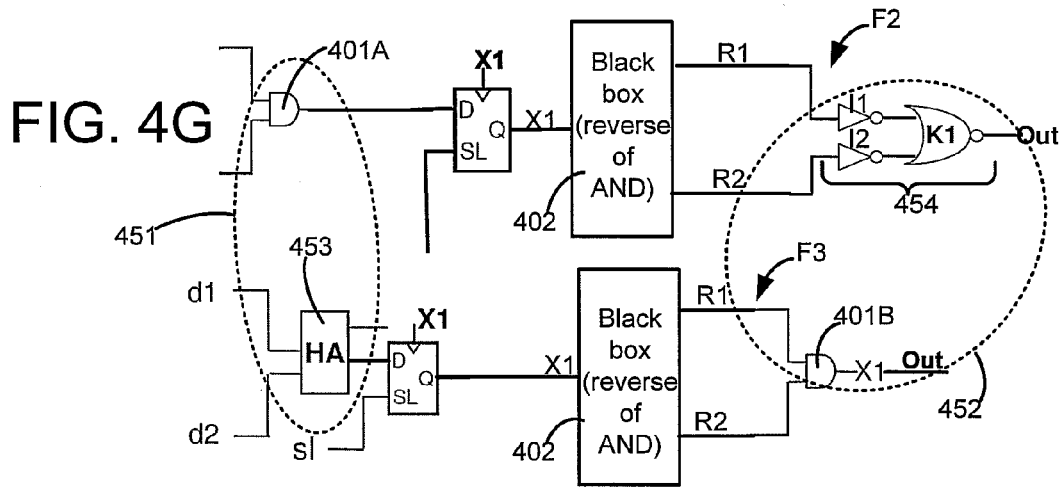
FIG. 4G illustrates matching of transformed IC designs F2 and F3 shown in the respective FIGS. 4E and 4F, during combinational equivalence checking in accordance with the invention.

As shown by dotted lines 451 and 452 in FIG. 4G, compare points are easy to find in the just-described two designs, due to their transformations to match one another by the presence of black boxes (both labeled 402). Specifically black boxes 402 are identically named and match each other in the two transformed designs F2 and F3. Hence, when using these compare points, the combinational equivalence checker needs to prove that newly-added AND gate 401A in the transformed reference design F2 is identical to the carry pin of the half-adder 453 in the transformed retimed design F3, as shown encircled by dotted line 451. Moreover, the combinational equivalence checker needs to prove that newly-added AND gate 401B in the transformed retimed design F3 is identical to the combination of inverters I1 and I2 and OR gate K1 (together shown as 454 in FIG. 4G) in the transformed reference design F2, as shown encircled by dotted line 452. Such comparisons are easily made by any combinational equivalence checker of the prior art, after transformed designs F2 and F3 are created as described herein.

Note that a flag indicating the beginning of a logical relationship may be different in different embodiments, for example in FIG. 2 the words "LOGICAL RELATIONSHIP" are used in move 220, while in FIG. 4A the term "Guide_retiming" is used. In some embodiments, instead of an ASCII text string, a numeric code is used to flag (i.e. identify) the type of information in file 210. Note that there is nothing critical about the specific flag which is used in file 210 to distinguish each logical relationship from its adjacent moves and/or any other setup information, as long as the flag is known to both tools 203 and 206 (that respectively produce and consume file 210). Some embodiments generate a file 210 containing a number of atomic moves which are described using a) a representation of the combinational logic function across which the move occurred (or of an FM_FORK), b) the direction of the move, c) an association of sequential cell identifiers prior to the move with either the inputs (forward) or outputs (backward) of the Boolean function, and d) an association of sequential cell identifiers subsequent to the move with either the outputs (forward) or the inputs (backward) of the Boolean function.

The format of the representation of the combinational logic function and the input/output to sequential cell identifiers association can be chosen freely, depending on the embodiment. Some of the embodiments illustrated herein have chosen library cell names and pin names to facilitate this. The keyword "guide_retiming" is only needed in some embodiments, to distinguish the retiming information from other information contained in the file. The design name of a block or sub-block is used in some embodiments wherein there is a hierarchical design which contains sub-blocks which are retimed (instead of the entire top-level design). Certain other embodiments do not support a "design" parameter, and instead all sequential cell names are identified relative to the top level design. If only a sub design has been retimed, it is a matter of convenience (shorter sequential cell names relative to the subdesign) to have the design parameter. A syntax for the retiming moves in file 210 for some embodiments is illustrated in Appendix B below.

An IC design transformer of the type described above (e.g. in reference to FIG. 3A) may be optimized by programming it to perform the logical relationship on the null-effect logic of FIG. 4B prior to its addition to reference IC design F1. Specifically, in some embodiments, the IC design transformer is programmed to ab-initio create a circuit 501 illustrated in FIG. 5A by including in the combination a sequential cell X1 located between white box 403 and black box 402.

Figure 1C:
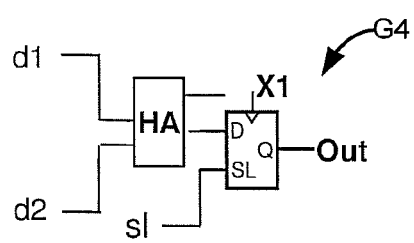
Figure 1D:
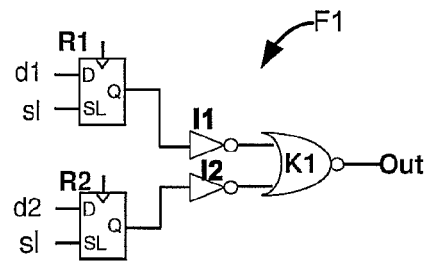
Figure 1E:
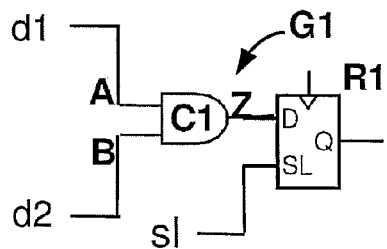
Figure 1F:
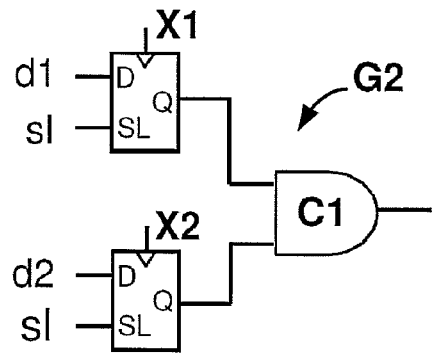
Figure 1G:
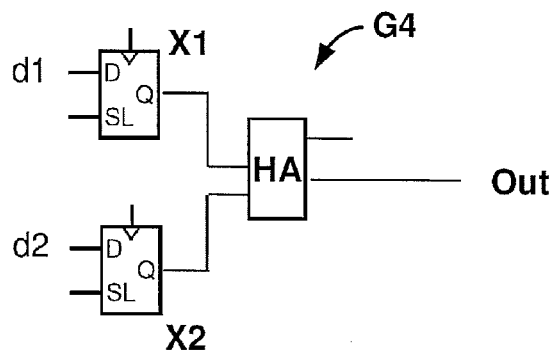
Figure 1H:
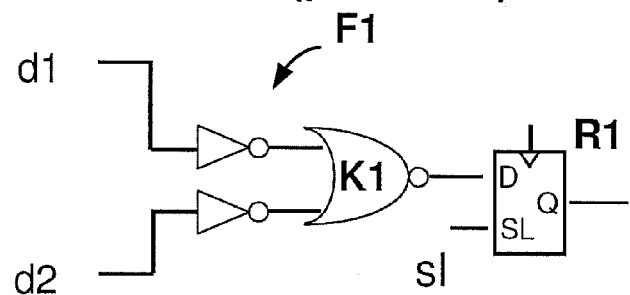

Note that circuit 501 is created up front which avoids performing the above-described sequential cell move. Circuit 501 of FIG. 5A is also referred to herein as a "replacement" circuit because it is thereafter used to replace the two sequential cells R1 and R2 in the reference IC design F1 (FIG. 1D). A similar circuit 502 is shown in FIG. 5B and it includes a sequential cell X1 at its input (i.e. upstream of black box 402 which in turn is upstream of white box 403). Circuit 502 of FIG. 5B is used to replace sequential cell X1 in the retimed IC design G4 (FIG. 1C). Therefore, in such embodiments, an IC design transformer operates on both IC designs in a similar fashion, to replace sequential cells undergoing movement, with the corresponding replacement circuits.

In several embodiments, IC design transformer also automatically creates a Boolean constraint based on each black box to enforce an inverse functionality performed by that black box. Use of such a constraint eliminates false positives. Specifically, a constraint is automatically created by use of signals at the pins of the black box (such as input signal X1 and output signals R1 and R2 of black box 402), and by use of a Boolean function performed in the corresponding white box. In the example of white box 403 which performs the Boolean function "AND" the following constraint is formed: X1=(R1 AND R2). This can be done in several ways, e.g. by making R1 and R2 into "don't care" signals, for the downstream compare points, whenever the constraint is not satisfied. Such constraint checking is useful in certain situations, e.g. if X1 cone receives as inputs the signals R1 and/or R2, through a feedback loop.

Some embodiments create a constraint design which contains a white box and a stack of 2-input XNORs and an AND gate. The constraint design has inputs which are the same as the black box inputs and has additional inputs which are the same as the black box outputs. The constraint design has only one output. The white box instance in the constraint design has inputs coming from the constraint inputs which are named as black box outputs. Each output of the white box connects to one of the inputs of 2-input XNORs. The other input of the XNOR connects to the corresponding black box input of the constraint design. XNOR outputs all ANDed together and the output of the AND gate drives the constraint design output. This constraint design is given to the formal verification tool (such as Formality) in the same manner as any other user supplied constraint. Hence, valid value combinations on the signals identified by the constraint design inputs are the ones that make the constraint design output go to 1.

Assume the black box inputs are A, B, C and its outputs are X, Y, Z. Then corresponding white box has inputs X, Y, Z and output A, B, C. Also assume the constraint design has inputs A, B, C, X, Y, Z. The constraint design has an instance of the white box that gets signals X, Y, Z and produces signals A, B, C at its outputs. In the constraint design those A, B, C outputs are compared to corresponding constraint design inputs A, B, C via a stack of 2-input XNORs. Also included in the constraint design is a multi-input AND gate that collects all XNOR outputs and produces an output for the constraint design.

FIG. 6A illustrates, in ASCII text, a logical relationship of some embodiments which is similar to FIG. 4A, except for the direction being backward in FIG. 6A. FIGS. 6B and 6C illustrate, in block diagrams similar to FIGS. 5A and 5B, combinations of a cell instance, a sequential cell, and a black box that are directly used to transform IC designs in some embodiments of the invention. FIGS. 6D and 6E illustrate the transformed IC designs after use of the combinations of FIGS. 6B and 6C, in some embodiments of the invention.

FIGS. 7A and 7B illustrate two logical relationships in the forward direction that are related to one another in some embodiments of the invention, by use of a commonly-named signal therein, in this example identified by use of the ASCII string "temp" therein, namely the signal "Temp 1". Note that although the word "temp" is used in some embodiments, other embodiments name the common signals differently, without using any keyword to distinguish between temporary signals and signals that denote sequential cells in the reference IC design or in the retimed IC design or both. When two (or more) logical relationships use common names (at input and output pins respectively), they are thereby related to one another (also called "chained"), and therefore they are used together to form a single white box (and a corresponding single black box). Although some embodiments do not use a keyword in common signal names, other embodiments do use the key word "temp". Certain embodiments that use a keyword determine that a signal is temporary directly from parsing the logical relationship itself. Other embodiments which do not use the keyword compare each signal name with two sets of names, one set of names for sequential cells in the reference design and another set of names for sequential cells in the implementation (retimed) design, and any names that are not present in either of the two sets are determined to be temporary names. Still other embodiments will be apparent to the skilled artisan, e.g. the tool 203 may pass to tool 206 a separate file (not shown) of temporary names, or include a separate list of temporary names in file 210 (which describes the logical relationships).

Before processing of logical relationships to transform the two designs, an IC design transformer of some embodiments reads all the logical relationships sequentially one after another. For example the logical relationship in FIG. 7A is read before the logical relationship in FIG. 7B regardless of whether or not there are temporary signals. After reading the logical relationships, the respective replacement circuits are formed whereby the gate 701 is instantiated and the output of the white box 702 (shown dashed) is the signal Temp1. The signal Temp1 is eliminated automatically during processing, as described next.

Figure 10B:
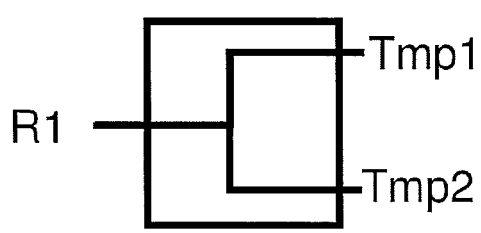
FIGS. 10B-10F illustrate a method of reading the sequence of commands in the example in FIG. 10A, in accordance with the invention.
Figure 10C:
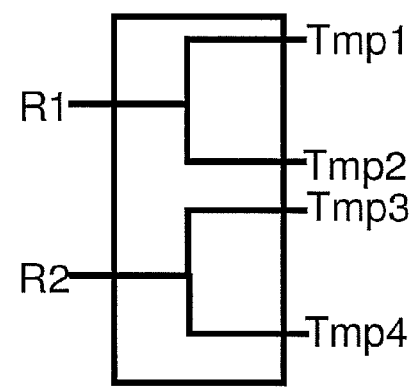
Figure 10D:
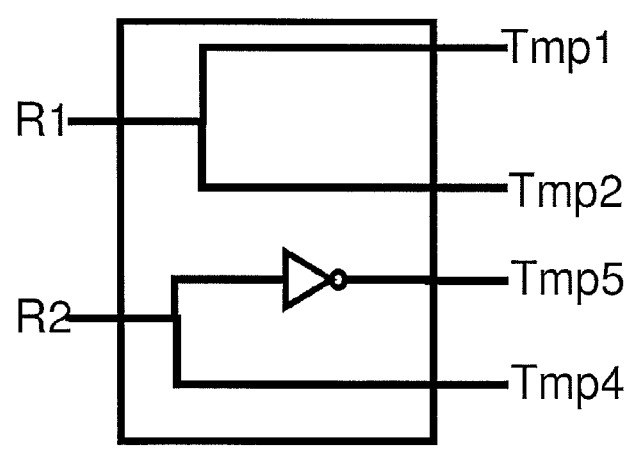
Figure 10E:
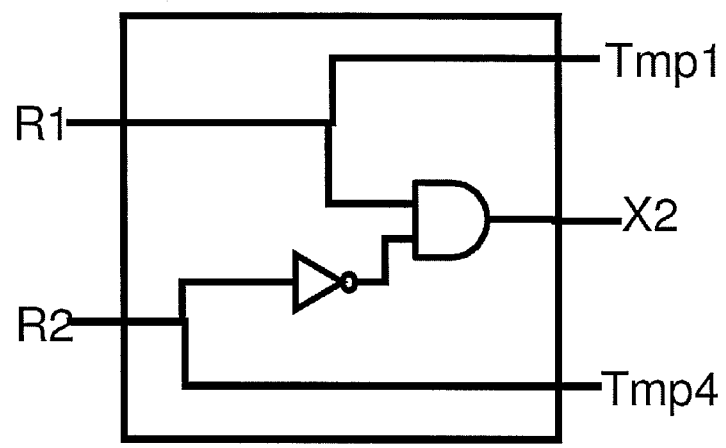
Figure 10F:
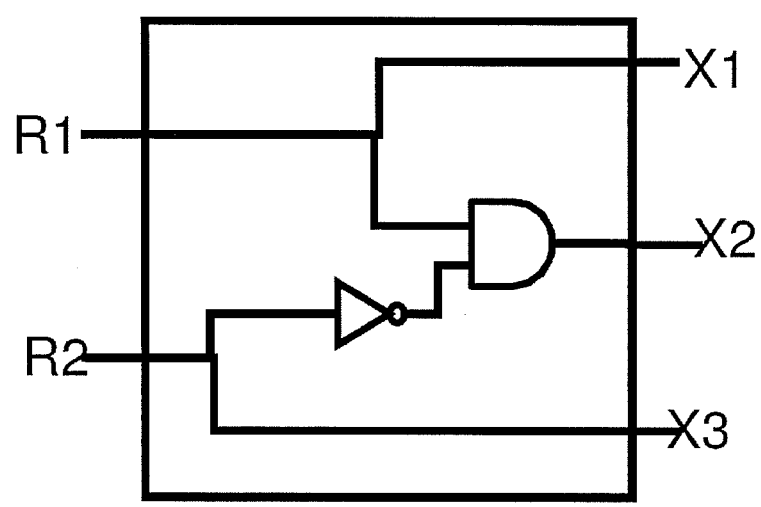

In several embodiments, temporary names are processed by tool 206 (FIG. 2) in the same order in which they are written to file 210 by tool 102. For example, tool 206 processes the logical relationships shown in FIG. 10A in sequence, as depicted in FIG. 10B to FIG. 10F. The white box shown in FIG. 10B is created after reading the first guide_retiming command in FIG. 10A. Moreover, the white box shown in FIG. 1C is created after reading the second guide retiming command in FIG. 10A, which now includes the first white box. Also, the white box shown in FIG. 10D is created after reading the 3rd guide retiming command shown in FIG. 10A, and so on. Finally, FIG. 10F shows the state after reading both 5th and 6th guide retiming commands. Notice that when tool 206 reads the 5th guide_retiming command shown in FIG. 10A, it naturally and automatically eliminates the signal_tmp_name_1 from the white box.

On processing this logical relationship (of FIG. 7B), the temporary signal output by box 702 becomes an input to AND gate 703. At this stage the white box 702 is enlarged into white box 704. Note that at this stage, as there are no further temporary signals at the output, IC design transformer now creates a black box (not shown) based on the functionality in white box 704, and which black box receives at its input pin the signal X1 and generates as its output the three signals R1, R2 and R3.

Note that in FIGS. 7A-7E, an item labeled 701 is an instance of a libCell and item 703 is an instance of another libCell, (both happen to be an AND gate in that figure). Note further that box 704 as a whole relates post-retiming sequential cell X1 to pre-retiming sequential cells R1 R2 R3 in a forward retiming relation. An example of forward moves which combine FIGS. 7A and 7B is as follows: guide_retiming-design {ALU}-boolean {Z=(A and B) and C}-direction forward-input {A:R1}-input {B:R2}-input {C:R3}-output {Z:X1}.

Although only two logical relationships are shown in FIGS. 7A-7C related to one another by a single temporary signal, it will be apparent to the skilled artisan, in view of this disclosure, that any number of logical relationships may be related among each other and any number of temporary signals may be used to form interrelationships therebetween. FIGS. 7D, 7E and 7F illustrate two logical relationships of some embodiments which are interrelated in the above described manner, except for the direction being backward.

While it is possible for certain embodiments to create black boxes while reading file 210, one black box for each individual move, many embodiments do not create black boxes when reading file 210. Instead, many embodiments read in all of the information in file 210 in its entirety, and this information is processed in the order received as illustrated by act 304 in FIG. 3A. Such embodiments create black boxes with appropriate inputs and outputs as per act 307 in FIG. 3A. Note that logic relationships in file 210 of some embodiments have names of blocks and/or sub-blocks specified therein, to take care of the correspondence between which moves are related to which designs or sub-designs, in cases wherein the entire design is not retimed. Some embodiments also check sequential cell classes (as described elsewhere herein), wherein all retimed sequential cells in a "molecular move" have the same sequential cell class.

More specifically, what is meant by use of block/sub-block design names is that some logical relationships (e.g. expressed as retiming move which are also called guides or moves) might have-design {A} some might have-design {B} in them meaning that they apply to different sub-designs. Since the order of moves in the file 210 (also called SVF file) is not important in some embodiments, they might become intermixed. The computer is programmed to note that the moves in file 210 refer to different parts of a design and creates different white boxes for them. SVF file reading software (which performs acts 303 and 304 illustrated in FIG. 3A) is included in an IC design transformer tool 999 (FIG. 9A) in accordance with the invention, The SVF file reading software creates the initial (large) white boxes as described above in paragraph [0067]. The IC design transformer tool 999 creates separate white boxes for each subdesign and for each given direction. Depending on the embodiment, IC design transformer tool 999 may or may not be integrated into a formal verification tool, such as Formality available from Synopsys, Inc.

Hence, retiming moves which have direction Forward and Design A all work on a white box, and all retiming moves with direction Forward and Design B work on a different white box. Several embodiments do not mix directions and sub designs in a given white box. Accordingly, a given white box in the computer automatically collects atomic moves for the same subdesign and in the same direction. This is done by creating a hash table for forward direction white boxes accessible by their design names, and another hash table for backward direction white boxes accessible by their design names. Accordingly, if a design name is same for all retiming moves or if the design always refers to the top design then the computer which has read file 210 has only two white boxes created: Forward and Backward (note that these white boxes are "initial" boxes which are expanded as the logical relationships are read from file 210, and then the resulting large white boxes are split by the IC design transformer 999 into smaller boxes at a later stage, in some embodiments).

Note that an order in which moves are described in file 210 is not important in several embodiments. In such embodiments, a formal verification tool 206 processes the moves in the order given in file 210. To do that tool 206 takes the first given atomic move (e.g. a retiming move in file 210) and creates a white box from it as if this move is the only atomic move in the file 210. Then continues expanding the white box by chaining the subsequent atomic moves. Tool 206 creates separate white boxes for forward and backward direction as follows. Specifically, tool 206 creates ports for the sequential cells names mentioned in the guide as given by -input and -output and connects those ports to appropriate pins of the instantiated libcell as given by the A: B: designations in-input. When tool 206 reads the second retiming move and if it happens to be in the forward (backward) direction, tool 206 adds the libcell to the existing forward (backward) white box, creates appropriate ports with sequential cells names. If the second retiming move has a temporary name in it, tool 206 checks if the same temporary name exists as a port in the white box. If it does exist, tool 206 eliminates that port and connect its net to the pin of the libcell in the second retiming move, thereby eliminating the temporarily named port from the white box.

For example in FIG. 7C, note that 702 is the original white box for forward retiming move 7A with a temp1 port. When tool 206 reads the logical relationship (also called "guide") in FIG. 7B, tool 206 notes that this move has temp1 as an input, so tool 206 removes temp1 output port form white box 702, connects it to A pin of the AND gate that is created with the FIG. 7B guide. Tool 206 then creates new ports for the rest of the sequential cell names. The rest of the sequential cell names could still have another temporary name that did not match to an existing port, but tool 206 later matches such names to a temp name in another logical relationship. Hence the white box expands into 704. Assume that the guide in FIG. 7B was supplied to tool 206 before the guide in FIG. 7A. Tool 206 creates a white box similar to 704 without the 702 in it but with the temp1 as an input port. Then tool 206 reads the FIG. 7A guide. Tool 206 sees that this move has temp1 as an output. Tool 206 finds the same temporary name as an input port in 704, then tool 206 eliminates input port temp1 and connects to the Z pin of the libcell. Hence including the 702 white box in the expanded 704 white box as shown.

Next, the IC design transformer 999 uses the white boxes and black boxes to prepare replacement circuits, and then replaces the corresponding registers with their respective replacement circuits in the designs F1 and G4, to create the transformed designs F2 and F3. After the transformations, the resulting transformed designs F2 and F3 can be verified by any combinational equivalence checking tool. It is immaterial how this is done. Formal verification tool 206 of some embodiments creates a "miter" from matching compare points, although miter creation is not done in other embodiments.

Some embodiments prepare and use a file 210 (FIG. 2) as described below in reference to FIGS. 8A-8T. In the following description of FIGS. 8A-8T, various terms are used with specific meanings as discussed next.

A 'forward retiming move' is performed on a combinational cell C. Each input pin p_i of C is either connected to a constant net or a net n_i driven by a sequential cell S_i. S_i must be the only driver of the net n_i and p_i must be its only load pin. The retiming forward move performs the following steps: (1) Remove the sequential cells at S_i at each non-constant input pin p_i of C and connect p_i to the net that previously drove the next-state pin of S_i, and (2) For each output pin p_o of C that has a net n_o connected to it, create a new sequential cell S_o, connect the output pin of S_o to n_o. Create a new net connecting p_o to the next-state pin of S_o. Note that the connections of the control pins of the new sequential cells are not relevant for the purposes of generating the retiming moves descriptions in file 210 and hence they are not described. See FIGS. 1A-1B which illustrate a retiming forward move.

A 'backward retiming move' is performed on a combinational cell C. Each output pin p_o of C is either not connected to a net or a net n_o whose only load is the next-state pin of a sequential cell S_o. n_o must have no driver pins other than p_o. The retiming backward move performs the following steps: (1) Remove the sequential cells at S_o at each output pin p_o of C with a load and connect p_o to the net that previously was driven by the output pin of S_o; and (2) For each input pin p_i of C with a net n_i connected to it, create a new sequential cell S_i, connect the next-state pin of S_i to n_i. Create a new net connecting p_i to the output pin of S_i.

As above, the connections of the control pins of the new sequential cells are not relevant for the purposes of generating the retiming moves descriptions in file 210 and hence they are not described. See FIGS. 1E-1F which illustrate a retiming backward move.

In addition to the requirements given already above, retiming is not performed in these embodiments under the following circumstances: (1) no retiming move across primary inputs, primary outputs, constant cells, combinational cells with inout pins and sequential cells; (2) if a net has more than one driver a sequential cell driving the net cannot be used in a forward move; (3) if a net has more than one driver a sequential cell that is a load of the net cannot be used in a backward move. Since the function of cells with unconnected input pins is not defined, assume that this situation does not occur. The function can be made defined by connecting the input pin to a constant zero net in these cases.

Retiming algorithms can in general be executed in two forms as discussed next. (1) A retiming algorithm is executed which computes a retiming value r(C) for each combinational cell C in the netlist. A retiming value r(C)=0 means that no retiming moves are to be performed across C. r(C)>0 mean that r(C) backward retiming moves are to be performed across C. r(C)<0 means that-r(C) forward retiming moves are to be performed across C. The retiming algorithm often operates on a data structure different from the netlist. The retiming values are then used to remove the original sequential cells in the netlist and create and connect the new sequential cells after retiming. This detailed description of the invention refers to such an algorithm as a "global" retiming algorithm. (2) Retiming moves are executed one by one on the netlist. Which move to perform next is decided by various criteria. This type of retiming is sometimes referred to as "incremental", "greedy" or "local" retiming.

Examples for global retiming algorithms are those by Leiserson, Rose and Saxe [1] or Deokar and Sapatnekar [2]. There are many modifications of these algorithms for efficiency or quality. An example for such a modification is the publication by Shenoy and Rudell [3]. An example for an incremental retiming algorithm is given in the paper by Singh et al. [4]. Each of the following four papers are incorporated by reference herein in their entirety, as background: [1] C. E. Leiserson and F. Rose and J. Saxe, "Optimizing synchronous circuitry by retiming", Proc. of the 3rd Caltech Conf. on VLSI", March 1983, Pasadena, pp. 87-116"; [2] R. B. Deokar and S. S. Sapatnekar, "A Fresh Look at Retiming via Clock Skew Optimization" Proc. of the 32nd Design Automation Conference, June 1995, San Francisco, pp. 310-315; [3] N. Shenoy and R. Rudell, "Efficient Implementation of Retiming" Proc. of ICCAD, November 1994, San Jose, pp. 226-233; and [4] D. P. Singh and V. Manohararajah and S. D. Brown, "Incremental Retiming for FPGA Physical Synthesis", Proc of the 42nd Design Automation Conference, June 2005, Anaheim, pp. 433-438.

The method for formal verification of retiming described here is believed by the inventors to work with both global and incremental retiming algorithms and with any variant of the global retiming algorithm.

Besides retiming moves across combinational cells, another transformation for sequential cells that can occur is splitting and merging of sequential cells whose next-state pins are connected to the same net. Merging of sequential cells means the combination of two or more sequential cells whose next-state pins are driven by the same net into a single sequential cell. See FIGS. 8G-8I which illustrate backward merge move. All the nets driven by the output pins of the combined sequential cells will be replaced by a new net that is driven by the output of the new sequential cell and has as loads all the load pins of the original nets.

Splitting a sequential cell means creating additional sequential cells whose next-state pin is driven by the same net as the next-state pin of the original cell. See FIGS. 8A-8C which illustrate a forward splitting move. One or more of the load pins of the output net of the original sequential cell are transferred to the output nets of the new sequential cells. Splitting and merge can occur after all the retiming moves are done. The method described here can also be used to describe the split and merge moves after the end of retiming as long as (1) the same cell is not used in both the result of a split and the input to a merge move and (2) cells that are the results of backward retiming moves are not used in split moves and cells that are the result of forward retiming moves are not used in merge moves. Both conditions are fulfilled by retiming optimizations.

During creation of file 210 which describes retiming moves, the following information is used to exchange information between an optimization tool (such as retiming tool 203), and formal verification tool 206. (1) Technology library: a technology library is provided as a file that is read by both the optimization tool and the formal verification tool. It allows the two tools to use the same information about library cells. Alternatively it is possible to write Boolean equations describing the function of the cell in a standardized form into file 210. In that case the use of the library cell name is not required in file 210 to describe retiming moves. (2) Reference design: The reference design is the netlist before the optimizations (including retiming) to be verified take place. The netlist can either be provided as a file by the optimization tool to the formal verification tool or it can be derived from a common HDL specification by both tools. In any case, the names for the sequential cells in the reference design are the same inside both tools. (3) Implementation design: The implementation design is the netlist after optimizations (including retiming) have been performed. The implementation design is provided to the formal verification tool by the optimization tool. Therefore both tools use the same names for cells in the implementation design as well (4) The file 210 (an illustrative implementation of which is called "SVF" file) which provides the information about the optimizations that are performed. File 210 is created by the optimization tool and read by the verification tool, in an illustrative embodiment.

The following paragraphs describe how the SVF file is filled with information that describes how the sequential cells after optimization functionally relate to the sequential cells before optimization (i.e. logical relationships). The following description is in three parts. A first part describes how backward and forward retiming moves across a single cell (which are illustrative embodiments of logical relationships) are written to the SVF file (wherein they are called SVF moves). The second part describes how to translate "r-values" obtained by a global algorithm into a correctly ordered sequence of local retiming moves. This second part is only needed for global retiming algorithms. The third part describes how to provide information about sequential cell splitting and merging after the retiming moves have been written.

Generating SVF output for a single cell retiming move (i.e. a single logical relationship in some embodiments) is discussed next in reference to the methods of Appendix A, which use a temporary name. A temporary name is a name that is different from any sequential cell name before and after retiming. A way to generate unique temporary names is to preselect a prefix name, which cannot be part of any sequential cell name and then append a character string representing an integer number to it. The integer number used to create the string is incremented each time a new temporary name is requested. This is implemented by a function get_temp_name( ) which is used in pseudo code in Appendix A below. Note that Appendix A provides a detailed description, in pseudo-code form, for one illustrative implementation in accordance with the invention, and is incorporated by reference herein in its entirety.

The functions of Appendix A always assign temporary names to all newly created or renamed sequential cells. In the simplest case assume that the temporary names for the final sequential cells remaining in the netlist, after all SVF moves have been written, become the final names. If different names are desired to be implemented in some embodiments, it is possible to create additional logical relationships in the form of fork moves with just one output to inform the verification tool about the relation between the final temporary name and the actual name of the sequential cell in the implementation design. This can be done as part of the final alignment for split and merge moves.

Also assume that there is a function write_svf (design_name, lib_cell_name, direction, in_pins, out_pins) which writes the logical relationship information to the file given the five parameters. In_pins and out_pins are lists of pairs of input pins and sequential cell names or constant literals. The functions of Appendix A assume to be given the following information: (1) Cell C across which to execute the move; (2) Set PI(C) of input pins of C; (3) Set PO(C) of output pins of C; (4) For each pin p in PI(C) or PO(C) net(p) is the net connected to p; (5) For a net n driver(n) is the driver pin of the net and PL(n) is the set of load pins of n; (6) For a pin p cell(p) is the cell of the pin; (7) For a sequential cell S output(S) is the output pin of S, next_state(S) is the next-state pin of S.

Further assumptions for the description on the Appendix A are as follows. The name of the library cell of cell C can be obtained using function lib_cell(C). The name of the design (i.e. netlist) being worked on is provided as "design". The number of elements in a set can be obtained using the function size( ). The function new_cell( ) creates a new sequential cell. The function new_net( ) creates a new net. The following convention is used: If a pin is connected to a net it is automatically unconnected from the net it was connected to up to that time. The function connect (pin, net) performs the connection of a pin and a net. ∞ means an empty character string. And constant_value(n) returns the value of a constant net (either 0 or 1).

The creation of the SVF output (i.e. logical relationship) for a forward move is done in two steps. The first is the "splitting" of the sequential cells driving more than one load. The corresponding SVF output involves forward moves across an "FM_FORK" (whose combinational logic function is identity, i.e. the output values are always identical to the input value). The second is the actual move across the cells C. Note that it is not necessary to perform the actual modification of the netlist in order to write the SVF output i.e. one can describe a virtual move. This is useful especially for global retiming, because one does not have to modify the netlist for every move. It is sufficient to know what the name or temporary names of the sequential cells before the move are, and what pins they are driven by and which pins they drive. This information can be stored outside of the netlist. The information about the sequential cells after the move has to be stored correspondingly.

Appendix A describes performing actual netlist modifications in procedures split_moves, main_forward_move, merge_moves and main_backward_move. Note that the main forward move is illustrated in FIGS. 8D-8F, whereas the main backward move is illustrated in FIGS. 8J-8L. As noted above, the forward splitting move is shown in FIGS. 8A-8C while the backward merging move is shown in FIGS. 8G-8I.

In Appendix A, procedure split_moves (C) describes forward moves which split a sequential cell. A forward move across the cell is performed by procedure main_forward_move. A backward move is also generated by performing two steps as follows. Procedure merge_moves merges multiple sequential cells that are driven by one output pin of C into a single sequential cell and reports this with a backward fork move in the file 210 (FIG. 2). Hence, this procedure is followed by procedure main_backward_move which performs the actual backward move across C.

The procedures split_moves, main_forward_move, merge_moves and main_backward_move are needed for creating the "normalized/SVF" move across as single cell. Specifically, in the attached Appendix A, Procedure split_moves (C) describes how to create the necessary forward fork moves on sequential cells at the inputs of cell C output prior to a main forward move across cell C. Each sequential cell that drives move than one load pin is split into two or more sequential cells such that each non-constant input of C is driven by exactly one sequential cell. Each split is recorded as forward fork move. After the split moves, the retiming tool 203 is sure that each input pin of cell C is the only load on a net driven by either a sequential cell S or a constant cell.

Moreover, in Appendix A, Procedure main_forward_move (C) describes how to generate the normalized move for a forward retiming move C after the necessary split moves have been performed. As described earlier in this document each sequential cell at the non-constant input pins is removed, the input pins are connected to the driver nets that previously drove the sequential cells. At each output pin of C a new sequential cell is inserted driving the original load. The entire move is recorded as a single normalized move.

Also, in Appendix A, Procedure merge_moves(C) describes how to merge multiple sequential cells driven by one output pin of C into one sequential cell and record the corresponding backward fork move. This is done prior to the main backward move for cell C. After the merge moves procedure, each output pin of C is either unconnected or the only driver of a net that has only the next-state pin of a sequential cell as a load.

Furthermore, in Appendix A, Procedure main_backward_move(C) describes how to generate the normalized move for a backward retiming move C after the necessary merge moves have been performed. As described earlier in this document each sequential cell at the (loaded) output pins is removed, the outputs pins are connected to the load nets that previously were driven by the sequential cells. At each input pin of C a new sequential cells in inserted driving the input pin and being driven by the original driver net. The entire move is recorded as a single normalized move.

Generation of the sequence of SVF moves is described next, assuming a given set of retiming values. Specifically, assume the global retiming algorithm has returned a retiming value for each cell, which can be accessed and modified by the function r(C). The procedure create_svf_moves of Appendix A executes the single cell moves in the correct order for the netlist. It is not important whether forward or backward moves are created first. It is also possible to interleave them. However, dependencies among retiming moves of any given direction are to be respected. This procedure create_svf_moves requires the two procedures can_execute_backward_move and can_execute_forward_move which determine whether a forward or backward move across a cell can be executed.

The following notations are used: N is the netlist, r(C) is the retiming value of cell C, F is a set of move candidates, ok is a variable that can take the values 0 or 1, fanout(C) is the set of combinational cells in the fanout of C treating any sequential cells as if they were transparent, and fanin(C) is the set of combinational cells in the fanin of C treating any sequential cells as if they were transparent (i.e. they would be removed and the nets at their next-state and output pins became one).

In the attached Appendix A, the procedure create_svf_moves, and the two auxiliary functions can_execute_forward_move and can_execute_backward move describe how to generate all the "normalized/svf" moves needed for retiming an entire design if a global retiming algorithm has been used that provides retiming (r) values for all the cells in the design/netlist. These functions use the previously described procedures for generating moves across single cells. The description of the variables used in these functions is provided above.

Moreover, in Appendix A, Function can_execute_forward_ move(C) returns 1 if a forward move across cell C can be executed because all non-constant input pins have a sequential cell connected to them. It does so by checking each input pin for being constant or being driven by a sequential cell. If no forward move can be executed the function returns 0. Also, in Appendix A, Function can_execute_backward_move(C) returns 1 if a backward move across cell C can be executed because all output pins with a load have a sequential cell connected to them. It does so by checking each output pin for either not having a net a or driving by sequential cell. If no backward move can be executed the function returns 0.

Furthermore, in Appendix A, Procedure create_svf_moves (N) describes how to create all the normalized moves for a retimed netlist N given the retiming values r(C) for each cell C in the netlist. Forward moves are output before backward moves. However the opposite is also possible. First a set F of forward move candidates is filled with cells C that can already perform a forward move. Then an iteration of the following steps is performed on each cell C in F until the set F is empty. The split moves and the main forward moves for C are executed. The retiming value of r(C) is incremented. Now a decision is made whether to keep C in F. C is removed from F if r(C) is zero (i.e. all necessary retiming moves on C have been performed) or if it currently cannot execute a forward move because one or more of its non-constant inputs do not have a sequential cell connected to it. Due to the forward move across C cells in the fanout of C may have become able to execute a forward move. Therefore all fanout cells D are checked whether they a) still have to execute forward moves (r(D)<0) and can execute the forward move. The corresponding operations happen for the backward moves. Here it is necessary to check whether backward moves are possible across a cell and have to decrement the initial retiming values until they are zero.

Generation of SVF moves for sequential cell sharing is described next. Once writing all retiming moves to the SVF file is completed, there may not yet be a one to one correspondence between the sequential cells in the implementation design and the sequential cells being used to write the SVF file, after finishing all retiming moves because of sequential cell splitting and merging. The following procedure (see procedure final_sequential_cell_alignment et seq. in Appendix A) prepare the SVF moves to create the one to one correspondence. It is only necessary to apply these procedures if the split and merge moves have not be made explicitly, i.e. the resulting structure of sequential cell trees is the result of a method that does not use split and merge moves. Local retiming methods do make the split and merge moves explicit and do not need these procedures. Global retiming needs these procedures.

In these procedures, Ni is the implementation design and Ns is the result of applying the retiming SVF moves to the netlist being optimized. Ni and Ns have a one to one match between their combinational cells to the level of pins. However, the sequential cells may still be mismatched. Note that for the implementation of these alignment moves it is not necessary to keep two netlists in memory. The status of the result at the end of the retiming SVF moves can be stored with auxiliary data structures on the implementation design.

These procedures look at the trees of sequential cells in the fanout of a particular combinational cell pin in both netlists and create correspondences mapping either one sequential cell from Ni to one or more sequential cells from Ns resulting in a merge move of one sequential cell from Ns to one or more sequential cells from Ni resulting in a split move. Other situations do not occur, if the preconditions mentioned earlier are fulfilled.

See FIGS. 8M-8P. Note that Ti, Ts are tables mapping input pins to lists of sequential cells. Li, Ls are lists or arrays of sequential cells. A list here means that the order is important. Elements can be accessed by indices 0 to the number of list elements minus one. Mi, Ms are tables mapping a sequential element from Ni, respectively Ns to a set of one or more sequential cells from the other netlist. Si and Ss are such sets. Ci and Cs are sequential cells from Ni and Ns. Procedure duplicate( ) is a function that creates a duplicate copy of an object. Finally, procedure write_table_svf_moves writes out the SVF moves shown in FIGS. 8R-8T. Note that in the following Appendix A, the procedure get_fanout_table_recursive works with pins nets and cells in the given netlist N.

Note that in the attached Appendix A, the procedures and functions final_sequential_cell_alignment, net_has_at_least_one_next_state_pin, align_pin_fanout, get_fanout_table, get_fanout_table_recursive, create_one_to_many_mappings and write_table_svf_moves describe how to create "normalized/SVF" fork moves for any necessary sequential cell alignment after all the retiming moves of the global retiming have been created. The description for the variables used in these functions are found above.

Moreover, in appendix A, Procedure final_sequential_cell_alignment(Ni, Ns) describes how to create normalized moves to describe any necessary sequential cell alignment after all regular retiming moves have been finished. Ni and Ns are the netlists described previously in paragraph [00132]. The procedure iterates on all output pins of combinational cells. If the output pin of the cell drives at least one sequential cell an alignment is performed.

Also, in Appendix A, Function net_has_at_least_one_next_state_pin(n) returns 1 if at least one of the load pins of the given net n is a next-state pin of a sequential cell. It returns 0 otherwise. The return value is determined by checking all load pins of the net until a next-state pin has been found.

Furthermore, in Appendix A, Procedure align_pin_fanout (p, Ni, Ns) describes how to create alignment move for one output pin p with sequential cells in its fanout. It is a three step procedure. First tables mapping the combinational pins in the fanout of p to the sequences of sequential cells that have to be traversed to reach them are created for both netlists Ni, Ns. Then the mappings between the sequential cells in Ni and the sequential cells in Ns are created by matching the entries in the previously created tables. From the matching results the forward an backward moves are created. This is done successively starting with the sequential cells that are connected directly to p, followed by those sequential cells driven by the first set of sequential cells and so on until no more sequential cells are found in the Ti and Ts tables.

Moreover, in Appendix A, Procedure get_fanout_table (p, N) describes how to get the tables mapping the combinations pins in the fanout of pin p in netlist N to the sequence of sequential cells that have to be traversed to reach them. This is done by calling a recursive procedure.

Also, in Appendix A, Procedure get_fanout_table_recursive (p, N, T, L, i) is the recursive part of get_fanout_table( ). Index i counts the level that has been reached so far. L is the list of sequential cells found so far in the recursion. T is the table mapping combinational fanout pins to lists of sequential cells traversed on the path from pin p to the combinational fanout pin. N is the netlist on which the table is generated. The function starts from the current pins, iterates on all sequential cells in the fanout, adds the sequential cell to the list L in position i and then continues recursion at the output pin of the sequential cell with a duplicate of the list. If a combinational cell is reached in the fanout a table entry in T is created with the combinational cells pins as the key and a duplicate of the current sequential cells list as the data.

Furthermore, in Appendix A, Procedure create_one_to_many_mappings (i, Ti, Ts, Ms, Mi) uses the tables Ti and Ts created previously by get_fanout_table for netlists Ni and Ns to create new tables Mi and Ms that represent one to many relations between the sequential cells in "slice"i in the fanout of the pin being currently processed. "Slice" refers to all the sequential in the fanout of a pin p that have the same number (0, 1, 2, . . . ) of sequential cells between them and p. I.e. For i=0 the computer works with the sequential cells in the immediate fanout. For i=1 the computer works with the sequential cells that have one sequential cell between them and p, and so on.

The just-described procedure create_one_to_many_mappings (when implemented in a computer) iterates on each combinational fanout pin p used as key in Ti and Ts. Note that both tables have the same keys. For each pin p, obtain the cells Ci and Cs at position i in the corresponding list Li and Ls. Now either create an entry in tables Mi or Ms or add to an existing entry in either of the two. If there is already an entry with key Ci in table Mi, Cs is added to the set Si which is the data for key Ci in Mi. Similarly if an entry with key Cs exists in Ms, Ci is added to the corresponding cell data set.

Note the there cannot be both cases (i.e. an entry for Ci in Mi and an entry for Cs in Ms) at the same time. Then the final alignment would not have been performed to minimize the sequential cell count. If neither an entry for Ci in Mi nor an entry for Cs in Ms exists, a new entry is created. The decision is made based on whether the cell Cs in the netlist Ns (the netlist after applying all the retiming moves) is the result of a forward move. If yes, add a new entry to table Ms with Cs as key and Ci as the cell in the data set Ss. The decision is made this way because cells that are the result of forward move are already maximally merged. If they are part of a further move it would be a forward fork move and so expect this cell Cs to be the cell split into two or more cells (or just being renamed). In the other case (Cs is not the result of any move or the result of a backward move) a table entry in Mi is created with Ci as the key and Cs as the first cell in data set Si.

Moreover, in Appendix A, Procedure write_table_svf_moves (M, direction) is used to write the actual fork moves for the entries in table M with the given direction. The cell that is the key for the table entry becomes the input of the fork and the cells or cell in the data set become the output(s) of the fork.

Figure 9A:
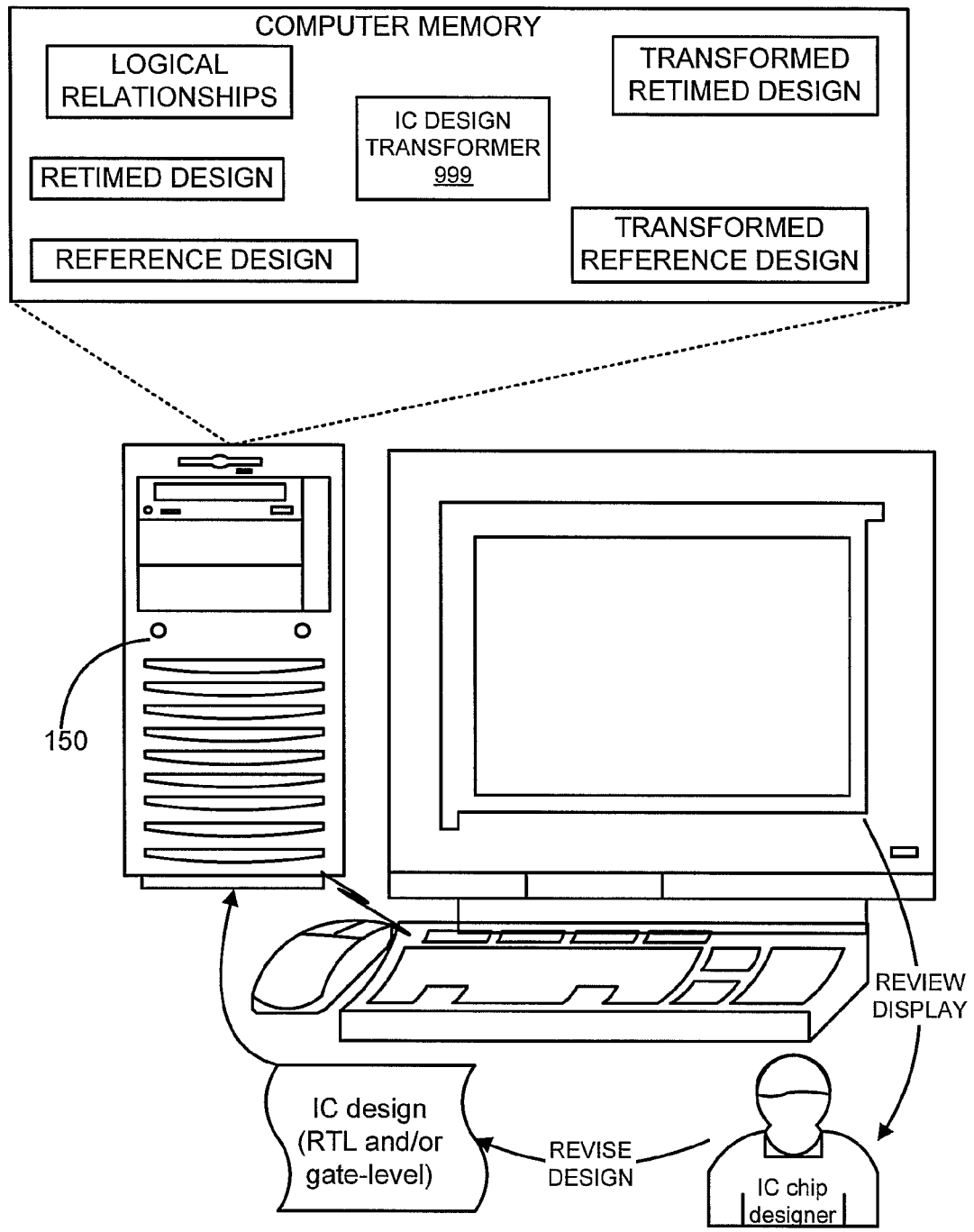
FIG. 9A illustrates, in a block diagram, a computer that is programmed in accordance with the invention.
Figure 9B:
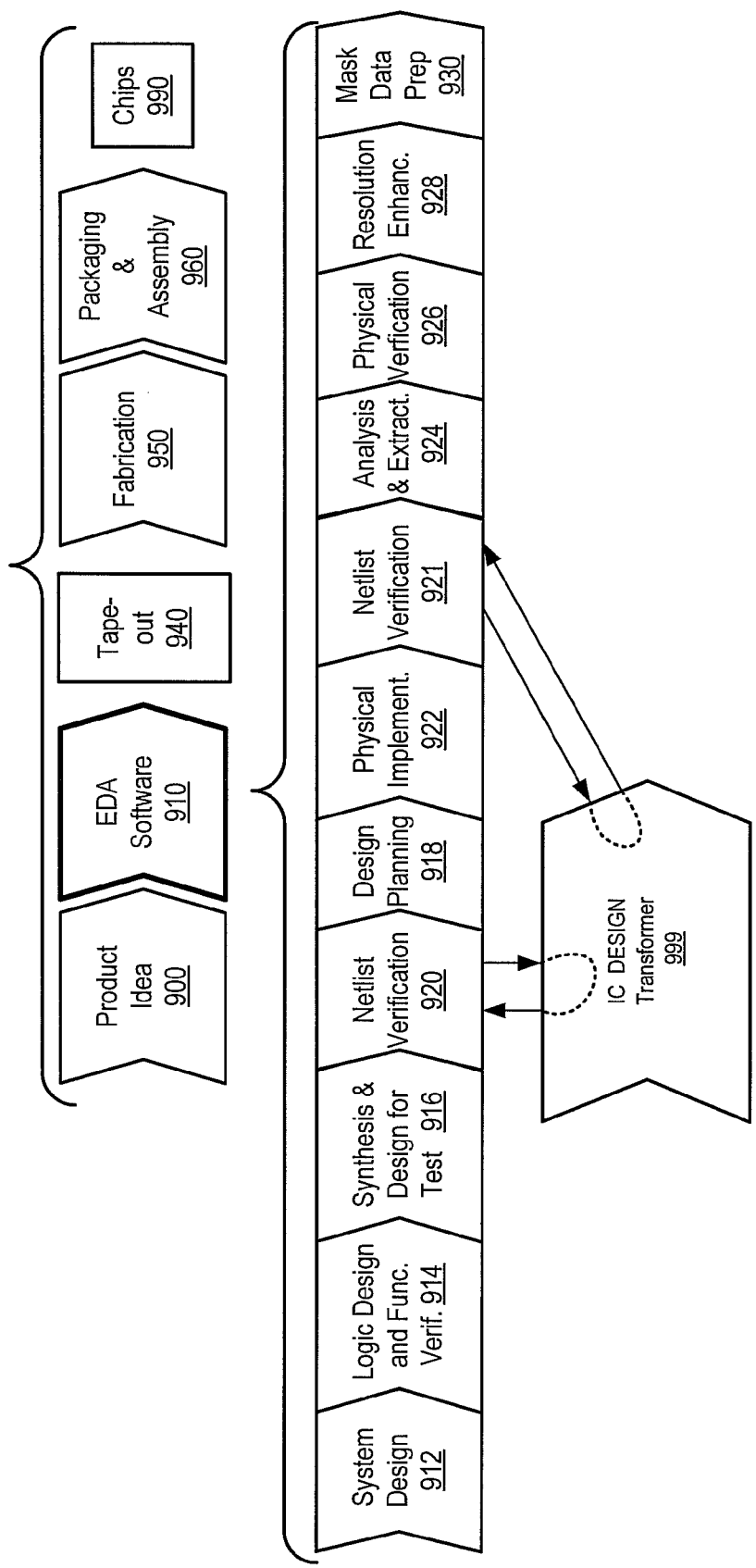
FIG. 9B illustrates, a simplified representation of an exemplary digital ASIC design flow in accordance with the invention.

Note that any IC design transformer of the type described above (e.g. in reference to FIG. 3A) may be used in a digital ASIC design flow, which is illustrated in FIG. 9B in a simplified exemplary representation. At a high level, the process of designing a chip starts with the product idea (900) and is realized in a EDA software design process (910). When the design is finalized, it can be taped-out (event 940). After tape out, fabrication process (950) and packaging and assembly processes (960) occur resulting, ultimately, in finished chips (result 990).

The EDA software design process (910) is actually composed of a number of stages 912-930, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC. A brief description of the components of the EDA software design process (stage 910) will now be provided.

System design (stage 912): The circuit designers describe the functionality that they want to implement, they can perform what-if planning to refine functionality, check costs, etc. Hardware-software architecture partitioning can occur at this stage. Exemplary EDA software products from Synopsys, Inc. that can be used at this stage include Model Architect, Saber, System Studio, and DesignWare® products.

Logic design and functional verification (stage 914): At this stage, the VHDL or Verilog code for modules in the system is written and the design (which may be of mixed clock domains) is checked for functional accuracy. Exemplary EDA software products from Synopsys, Inc. that can be used at this stage include VCS, VERA, DesignWare®, Magellan, Formality, ESP and LEDA products.

Synthesis and design for test (stage 916): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this stage include Design Compiler®, Physical Compiler, Test Compiler, Power Compiler, FPGA Compiler, Tetramax, and DesignWare® products. Note that retiming and resynthesis are part of the Design Compiler® product. Therefore, retiming and resynthesis are used in stage 916. Note that retiming is not limited to stage 916—i.e. it may occur in other stages, such as stage 922.

Netlist verification (stage 920): At this step, the netlist is checked for compliance with timing constraints and for correspondence with the VHDL/Verilog source code. Exemplary EDA software products from Synopsys, Inc. that can be used at this stage include VCS, VERA, Formality and PrimeTime products. Note that an IC design transformer 999 (of the type described above in reference to FIG. 3A) can be used during this stage 920, as shown in FIG. 9B. If the displayed results are not satisfactory, a chip designer may go back to stage 916 to make changes to the IC design as shown in FIG. 9A. Note that netlist verification may also be performed at a later time, as stage 921 in the design flow shown in FIG. 9A, which is performed after physical implementation (stage 922). Hence, IC design transformer 999 can also be used to compare original HDL to the netlist after physical implementation, if retiming occurred anywhere in the intermediate steps.

Design planning (stage 918): Here, an overall floorplan for the chip is constructed and analyzed for timing and top-level routing. Exemplary EDA software products from Synopsys, Inc. that can be used at this stage include Jupiter and Flooplan Compiler products.

Physical implementation (stage 922): The placement (positioning of circuit elements, such as the above-described sequential cells and combinational cells) and routing (connection of the same) occurs at this step. Exemplary EDA software products from Synopsys, Inc. that can be used at this stage include the Astro product. Although circuitry and portions thereof (such as rectangles) may be thought of at this stage as if they exist in the real world, it is to be understood that at this stage only a layout exists in a computer 150. Note that retiming may occur in stage 922.

As noted above, design flow shown in FIG. 9A includes another stage of netlist verification 921, after physical implementation. The actual circuitry in the real world is created after this stage, as discussed below.

Analysis and extraction (stage 924): At this step, the circuit function is verified at a transistor level, this in turn permits what-if refinement. Exemplary EDA software products from Synopsys, Inc. that can be used at this include Star RC/XT, Raphael, and Aurora products.

Physical verification (stage 926): At this stage various checking functions are performed to ensure correctness for: manufacturing, electrical issues, lithographic issues, and circuitry. Exemplary EDA software products from Synopsys, Inc. that can be used at this include the Hercules product.

Resolution enhancement (stage 928): This involves geometric manipulations of the layout to improve manufacturability of the design. Exemplary EDA software products from Synopsys, Inc. that can be used at this include iN-Phase, Proteus, and AFGen products.

Mask data preparation (stage 930): This provides the "tape-out" data for production of masks for lithographic use to produce finished chips. Exemplary EDA software products from Synopsys, Inc. that can be used at this include the CATS® family of products. Actual circuitry in the real world is created after this stage, in a wafer fabrication facility (also called "fab").

The data structures and software code for implementing one or more acts described in this detailed description can be encoded into any article of manufacture that includes a computer-readable storage medium. Depending on the embodiment, the computer-readable storage medium is any storage medium and/or any memory that can hold code and/or data for use by a computer. Storage medium includes, but is not limited to, magnetic and optical storage devices such as disk drives, magnetic tape, CDs (compact discs), and DVDs (digital versatile discs).

In one embodiment, the computer-readable storage medium includes computer instructions for carrying out one or more steps performed by the methods illustrated in FIG. 3A. In another embodiment, computer-readable storage medium includes an SVF file 210 of the type illustrated in FIG. 2, and an IC design transformer of the type illustrated in FIG. 3A.

Note that a computer system used in some embodiments to implement a IC design transformer of the type described herein uses one or more linux operating system workstations (based on IBM-compatible PCs) and/or unix operating systems workstations (e.g. SUN Ultrasparc, HP PA-RISC, or equivalent), each containing a 2 GHz CPU and 1 GB memory, that are interconnected via a local area network (Ethernet).

Numerous modifications and adaptations of the embodiments described herein will become apparent to the skilled artisan in view of this disclosure.

For example, although two forms of an identifier (of library cells or Boolean functions) are described above as being used in a logical relationship, other embodiments in accordance with the invention can use other such identifiers. Moreover, some embodiments may not even use identifiers, e.g. a netlist for an initial white box is supplied by a retiming tool as the setup information in file 210, for use by a formal verification tool as described herein.

Several embodiments of the invention do not create a constraint for each logical relationship or retiming move. Instead many embodiments create a constraint for each black box. The constraint is such that the black box is made to behave exactly like a white box's inverse. Some embodiments create a constraint design that has input ports with the same name as back box inputs and black box outputs, and the constraint design has one output. The constraint design has a white box instance included in it. The white box inputs are connected to input ports of the constraint design that are named same as black box outputs. The outputs pins of the white box instance are compared via XNORs to the inputs ports of the constraints design that are names as black box inputs. All XNOR outputs are combined via an AND gate and that drives the output port of the constraint design. A "1" value at the output indicates that the values at the constraint design inputs are compatible with the white box inverse operation.

For example if a white box is just a 2 input AND gate, the constraint design will have 3 inputs and one output. The constraint design produces 0 for 001 combination of its inputs but produces 1 for 010 combination of its inputs. Note that the value combination 00 as an input and 1 as an output is not compatible with an AND gate definition. This constraint design is supplied to the formal verification tool (e.g. Formality) as a user defined constraint and the formal verification tool automatically takes care of the rest. How this is done is not a critical aspect of the invention.

Several embodiments do not search for related moves. Instead the related moves are automatically identified through the use of temporary names. Temporary names in some embodiments may have the format_tmp_name__1234. The number at the end of a temporary name in these embodiments is a numerical identifier of the temporary name. Temporary names of such embodiments are once created (first appearance) and once used (second appearance). Hence, the same temporary name is used exactly twice. Such embodiments process the retiming moves in the order they are given in file 210, to create an initial white box before splitting. Splitting is not strictly necessary and hence it is not performed in certain alternative embodiments. Another alternative embodiment uses the initial white box unaltered, i.e. without splitting.

Figures 11A, 11B:
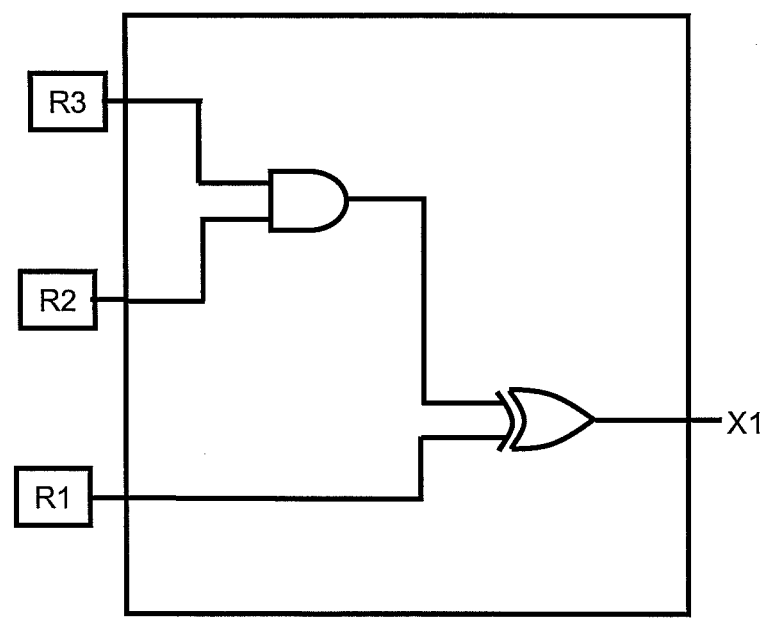
FIG. 11A illustrates an example of a complex retiming move in one embodiment in accordance with the invention.
FIG. 11B illustrates a white box generated from the retiming move illustrated in FIG. 11A.
Figures 12A, 12B:
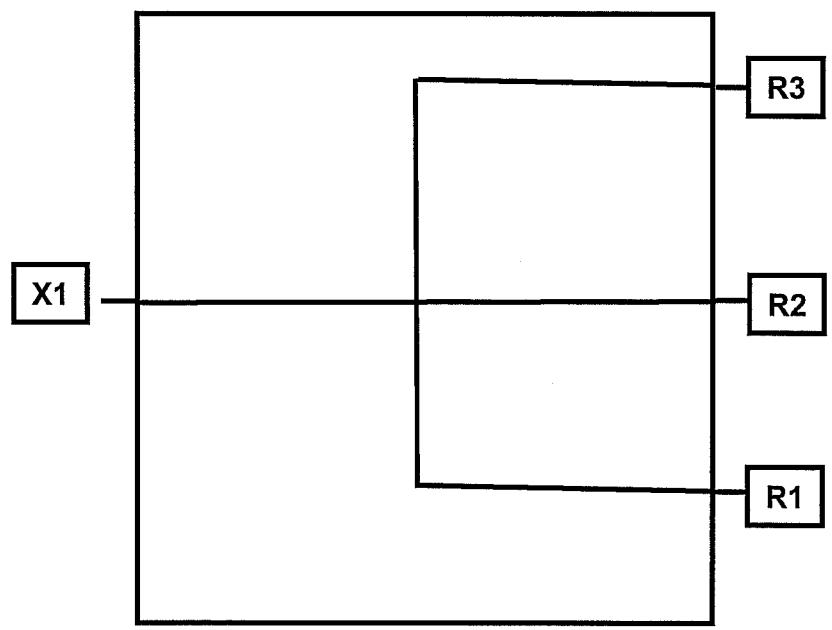
FIG. 12A illustrates a forward fork move (also called "split" move), and a white box generated therefrom is shown in FIG. 12B.

Also reading setup information from file 210 and creating white boxes can be done in any number of ways, depending on the embodiment. For example, the implementation might depend on the contents of file 210. Some embodiments have atomic moves in the file 210 to use them as created by the retiming tool (e.g. in the Design Compiler). Reading atomic moves information from file 210 and creating white boxes to create global view of retiming moves are done by a formal verification tool (e.g. Formality), in some embodiments before any transformation takes place. In alternative embodiments white box creation is done by a retiming tool which places a white box directly into file 210, e.g. in the form of a netlist. Several embodiments support complex retiming moves, an example of which is shown in FIG. 11A. A white box generated from such a retiming move is illustrated in FIG. 11B. FIG. 12A illustrates a fork move, and a white box generated therefrom is shown in FIG. 12B.

In certain embodiments, a white box by itself is an IC design. In the certain embodiments, the white box has input ports and output ports and gate instances and nets connecting those instances to each other and to the ports. Initially the white box is empty and does not have any ports, nets, and gates. Note that in some embodiments, retiming moves have the following parameters in the file 210: -libcell, -direction, -input, and -output. Therefore, input parameters in certain embodiments provide the input pin names of the libcell and the name of the sequential cell at that pin. Output parameters in the certain embodiments provide the output pin name of the libcell and the name of the sequential cell at that pin. The sequential cell name can be a real name or a temporary name. In the certain embodiments, the setup information from file 210 (called SVF below) is converted into a white box as follows:

1. create two empty white boxes one for forward and one for backward retiming moves
2. read the next retiming move from SVF
3. determine its direction (forward or backward) and get the corresponding white box, this is the current white box.
4. from the libCell parameter of the retiming move get the library cell name and instantiate it in the current white box
5. from the-input parameter of the retiming move, get the input pin name and sequential cell name
6. check if the sequential cell name is a temporary name or a real name
7. if it is a temporary name, then search the output ports of the current white box for a port with the same temporary name. If found, delete the output port and connect its net to the input pin (as obtained in step 5) of the libcell instance. Skip step 8. If not found, continue with step 8.
8. Here the sequential cell name is not a temporary name or temporarily named output port is not found. Create an input port for the current white box and name it as the sequential cell name as obtained in step 5. Connect the input port via a net to the input pin (as obtained in step 5) of the libcell instance.
9. go to step 5 for other-input options until all-input options are done
10. from the-output option of the guide_retiming get the output pin name and sequential cell name
11. check if the sequential cell name is a temporary name or a real name
12. if it is a temporary name, then search the input ports of the current white box for a port with the same temporary name. If found, delete the input port and connect its net to the output pin (as obtained in step 10) of the libcell instance. Skip step 13. If not found, continue with step 13.
13. Here the sequential cell name is not a temporary name or temporarily named input port is not found. Create an output port for the current white box and name it as the sequential cell name as obtained in step 10. Connect the output port via a net to the output pin (as obtained in step 10) of the libcell instance.
14. go to step 10 for other-output options until all-output options are done
15. go to step 2 until all retiming moves have been read from SVF.
16. When this step is reached all ports named as temporary should be eliminated and connected properly to a libcell pin. Check to see if there exists any input or output port named as temporary in the forward or backward white box. If not everything is fine, otherwise error.

FIG. 10A illustrates a set of retiming moves in an example file 210, and FIGS. 10B-10F show the above-described steps 1-16 are applied successively to the sequence of commands in the example in FIG. 10A. Specifically, the white box in FIG. 10B results from applying a first retiming move in FIG. 10A, and so on, as described above in paragraph [0094]. With each retiming move, the white box expands. At the end, in FIG. 10F, the white box shows the relationship between the sequential cells before and after retiming, and has no temporary names.

Numerous modifications and adaptations of the embodiments described herein are encompassed by the scope of the invention. For example, it is possible to reverse the blackbox-whitebox arrangement of the type described above in other embodiments and still achieve similar transformations of the retimed circuits. Note that in some embodiments, sequential cell, white box and black box arrangements, the black box is always placed downstream right after sequential cells.

Other embodiments use other arrangements that place black boxes in front of sequential cells and achieve the same results. Specifically, some embodiments use the following patterns, denoting sequential cell (R) white box (W) and Black Box (B) as depicted in FIGS. 5A, 5B and 6B, 6C to transform reference and retimed circuits: (A) for "forward replacement on reference design" use WRB; (B) for "forward replacement on retimed design" use RBW (note that BW is a noop); (C) for "backward replacement on reference design" use RBW (note that BW is a noop); (D) for "backward replacement on retimed design" use WRB. In these embodiments, forward moves are replicated on reference design and backward moves are reversed by moving forward on the retimed design.

An alternative uses the following patterns: (A) WBR for "forward replacement on reference design", (note that WB is a noop); (B) BRW for "forward replacement on retimed design"; (C) BRW for "backward replacement on reference design"; and (D) WBR for "backward replacement on retimed design" (note that WB is a noop). This alternative embodiment allows forward moves to be reversed on a retimed design by moving backward. And backward moves are replicated on reference design.

Another alternative embodiment mixes and matches these patterns, e.g. by using WRB and RBW for forward on reference and retimed designs respectively but using BRW and WBR for backward on reference and retimed designs respectively. This alternative embodiment has the advantage that it uses implementation side sequential cell names in transformed designs. Yet another alternative uses: WBR and BRW for forward, but RBW and WRB for backward. This embodiment uses reference side sequential cell names in transformed designs. In view of the just-described patterns, other patterns will be apparent to the skilled artisan.

In many embodiments, an arrangement of a white box relative to a black box in the retimed design is opposite to the corresponding arrangement in the reference design, regardless of the direction of retiming. Hence, some patterns have a common arrangement therein for the added boxes, e.g. patterns WRB and WBR both have the same arrangement, namely white box followed by black box (i.e. the order of flow of signals is from the white box's output to the black box's input). Accordingly, in view of the just-described arrangements of a white box and its black box (relative to one another within the just-described patterns), other such arrangements will be apparent to the skilled artisan.

Figure 13A:
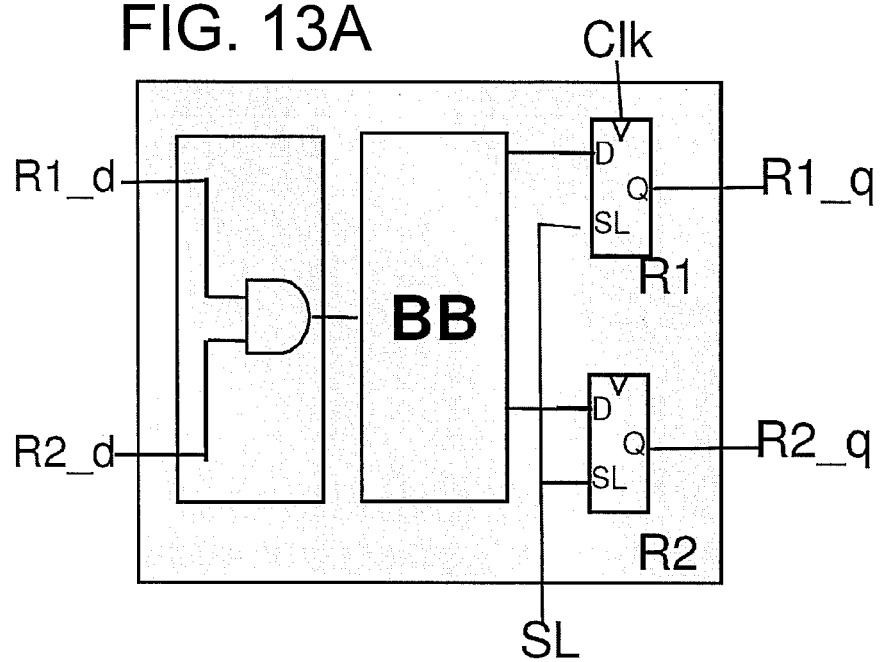
FIGS. 13A and 13B illustrate patterns (specifically WBR and BRW patterns) for forward retiming replacement circuits to be used for reference and implementation designs respectively, in place of the corresponding circuits shown in FIGS. 5A (showing WRB pattern) and 5B (showing RBW pattern) respectively.
Figure 13B:
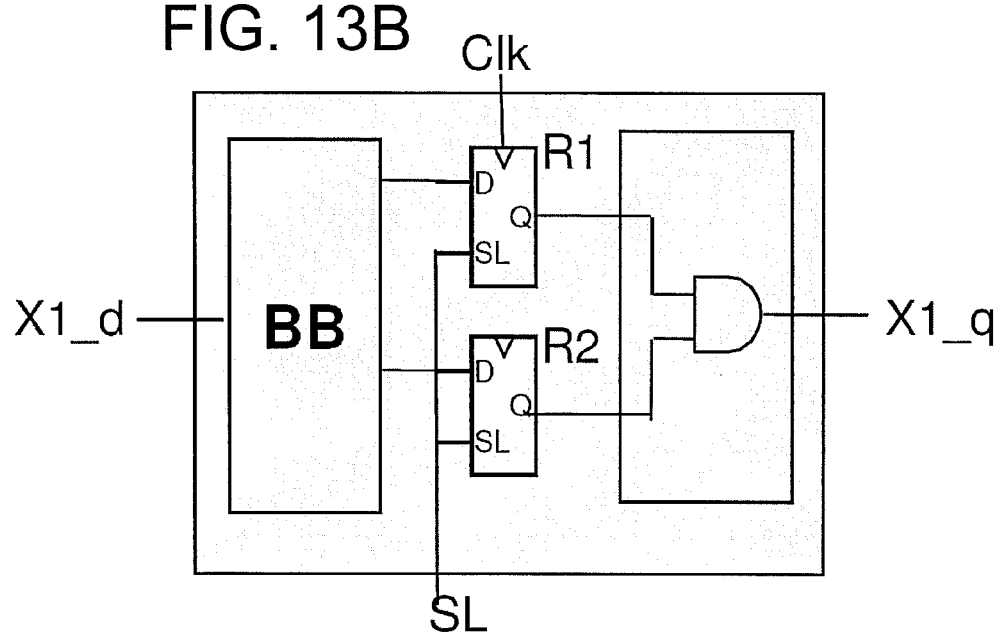
Figure 13C:
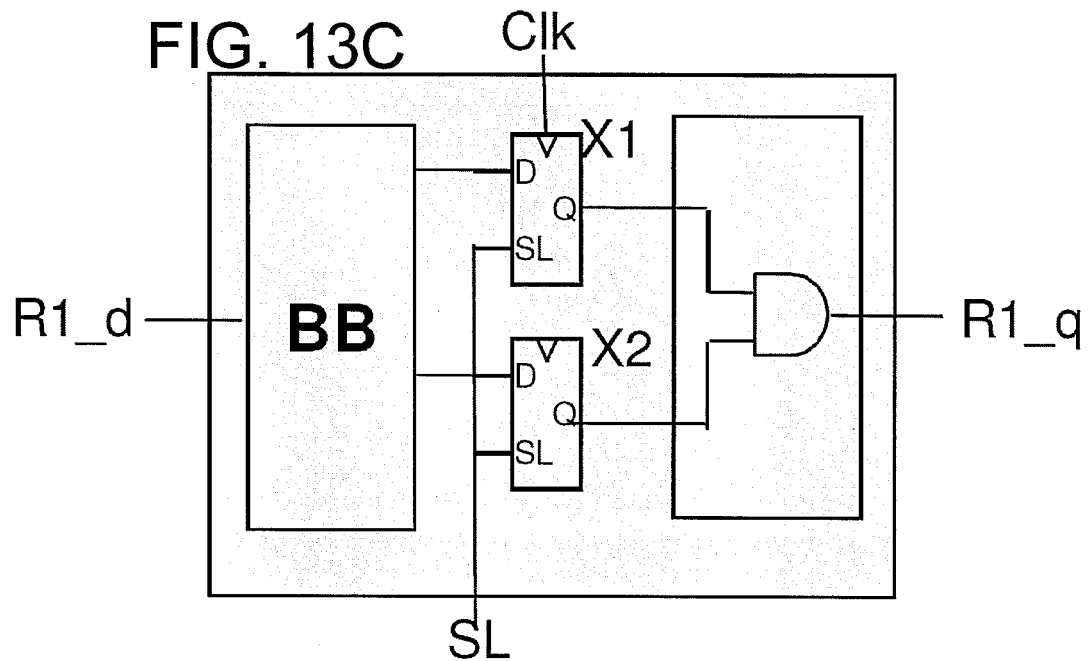
FIGS. 13C and 13D illustrate patterns (specifically BRW and WBR patterns) for backward retiming replacement circuits to be used for reference and implementation designs respectively, in place of the corresponding circuits shown in FIGS. 6B (showing RBW pattern) and 6C (showing WRB pattern) respectively.
Figure 13D:
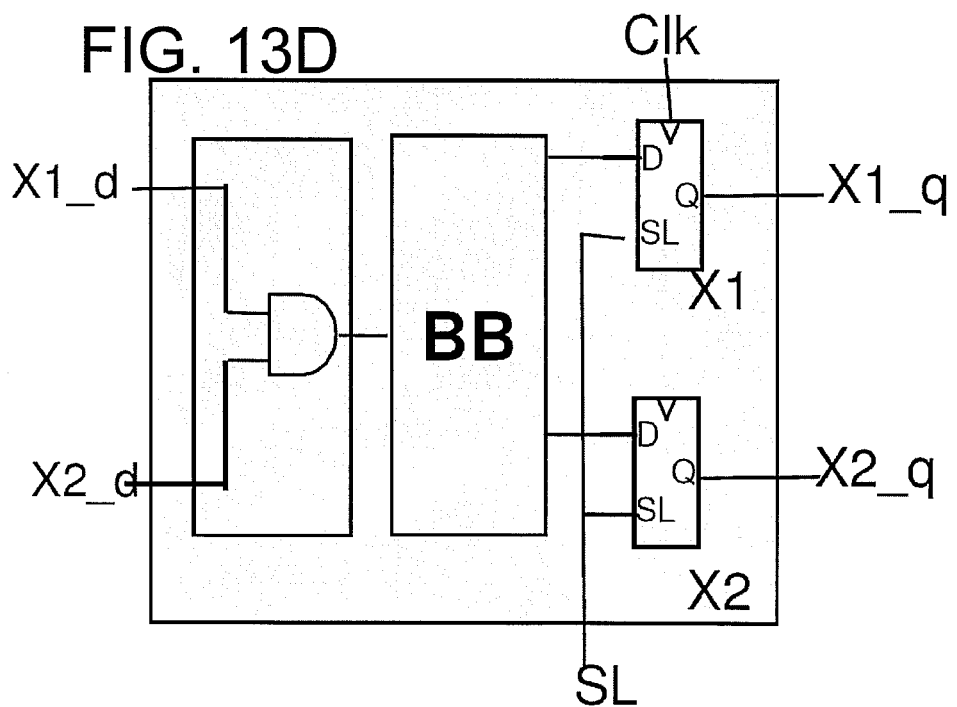

For example, three embodiments use the patterns as shown in the three rows of the following table:

| EMBODIMENT | FORWARD | BACKWARD |
|---|---|---|
| FIRST EMBODIMENT | WRB (FIG. 5A) & RBW (FIG. 5B) | RBW (FIG. 6B) & WRB (FIG. 6C) |
| SECOND EMBODIMENT | WRB (FIG. 5A) & RBW (FIG. 5B) | BRW (FIG. 13C) & WBR (FIG. 13D) |
| THIRD EMBODIMENT | WBR (FIG. 13A) & BRW (FIG. 13B) | RBW (FIG. 6B) & WRB (FIG. 6C) |
| FOURTH EMBODIMENT | WBR (FIG. 13A) & BRW (FIG. 13B) | BRW (FIG. 13C) & WBR (FIG. 13D) |

Note that although retiming tool 203 is shown in FIG. 2 as being separate and distinct from synthesis tool 102, in some embodiments both these tools are integrated into a single tool which also includes, for example, a re-synthesis tool and/or clock gating tool and/or scan insertion tool and/or any other such tools.

Tool 206 of some embodiments uses one or more overall logical relationship(s) between (a) sequential cells prior to retiming and (b) sequential cells after retiming. For example, in FIGS. 7A, 7B, 7C instead of supplying a retiming move shown in FIG. 7A across a single combinational cell (also called "atomic" move), and another "atomic" move shown in FIG. 7B, to describe as their combination (also called "molecular" move) illustrated in white box 7C tool 202 supplies just information that X1=R1 AND R2 AND R3, e.g. in a well defined form such as a binary decision diagram (BDD) or any other functional description. Hence, no temporary sequential cells are used in such embodiments. Specifically, the only sequential cells in an overall logical relationship of these embodiments are sequential cells present in either or both of (a) reference IC design and (b) retimed IC design.

In some embodiments, tool 206 internally converts all atomic move information (which uses temporary sequential cell names) to molecular move information, to form a white box as described above. In other embodiments, a tool provides molecular move information directly in a file 210 and tool 206 uses that molecular move information directly. Hence, tool 206 of the type described herein does not need to know how a particular individual retiming move has been physically made in going from synthesized design G1 to retimed design G2, as long as the overall logical relationship is specified.

Note further that the format of logical relationships can be different in different embodiments. For example, although many embodiments of retiming tool 203 ensure there is no instance-specific information except for sequential cell names in file 210, alternative embodiments of file 210 do contain instance-specific information about the combinational cells but this information is used in a manner similar to that described above (e.g. to identify cells in the library which are to be instantiated, or alternatively to prepare copies of the instance-specific information). Moreover, while several embodiments simply replace existing sequential cell(s) with a replacement circuit, alternative embodiments perform one or more moves of existing sequential cells after physical insertion of a white box and its black box into the reference IC design.

While some embodiments use black boxes as described herein, alternative embodiments do not use black boxes at all and instead just create ports in the two designs (which are being transformed), for use as new compare points. In these alternative embodiments, such ports are treated as primary outputs and primary inputs by the combinational equivalence checker, in a manner similar to that described herein for black boxes.

Furthermore, in several embodiments, the order of logical relationships is not critical, because the IC design transformer tool is programmed to handle any order (e.g. because act 304 of reading file 210 is separate and independent of act 307 in which instantiations are performed). Also as noted elsewhere, the information content of file 210 could be such that it only relates the logical (functional) relationship of the sequential cell prior to and after retiming. A formal verification tool (such as Formality) does not need to know each individual "atomic" move. Therefore some embodiments mark the original position of sequential cells in the pre-retimed design and traverse the logic from new position to old position. That way the "molecular" level move information is extracted. Moreover, the tools 102 and 206 may exchange move information without use of a file, e.g. by storing the information content (of file 210) in and retrieving the information content from a region in main memory that is shared by the two tools—i.e. use of a file structure, to transfer the information, is not a critical aspect of this invention.

Note that when the computer moves a sequential cell from one position of the circuit to another, the computer still makes proper connection at the original position of the sequential cell and breaks the connection at the new position to insert the sequential cell. Assume that a buffer is inserted at the original sequential cell position and the computer gives it a special name. After all the retiming moves got finalized the sequential cells are at their new positions and therefore these positions are known. In order to find the logic that the original sequential cells moved over to reach the new location, the computer could be programmed to traverse the circuit backwards from each new sequential cell stopping at the buffers that were inserted at the original sequential cell locations. By traversal what is meant is that start from a net, find the gate that drives it, jump over the gate to its inputs and do the same for each input until reaching the stopping criteria, which is the special buffer inserted in this case. The logic gate encountered during this traversal gives the molecular move directly, instead of the atomic move.

Alternatively, a retiming tool itself does what the formal verification tool does, to create the white boxes and supply the boxes themselves in the SVF file, in a well defined format. In one illustrative implementation, a retiming tool gives the atomic moves and the formal verification tool collects them, analyzes them and extracts the logical relationship between the final sequential cells and the original sequential cells. Note that how this is done or who does it can be different in different embodiments. Note also that individual (atomic) retiming moves are not needed for the transformation done by the formal verification tool. Accordingly, the invention broadly encompasses any use of one or more logical relationship(s) in the transformation of two circuits to make them comparable to one another. This is done, in some embodiments, by creation of replacement logic (also called "magic box") by use of white box-black box combinations, and replacing sequential cells in the F1 and G4 with the corresponding replacement logic.

Also depending on the embodiment, logical relationships may or may not be specified in the form of atomic moves by retiming tool 203. In embodiments wherein the logical relationships are specified in the form of atomic moves by retiming tool 203, further depending on the embodiment, the moves may be specified in any order, which is unrelated to the order in which the moves are in fact performed by the retiming tool (e.g. the logical relationship in FIG. 7B may be supplied before the logical relationship in FIG. 7A).

Moreover, in some embodiments, temporary names appear exactly two times in file 210—once when they are created, once they are destroyed (used). Also, a temporary name used in forward direction move is considered to be different than the same temporary name in backward move, and for this reason use of the same name does not cause any ambiguity when the direction is known. Note that chaining is purely based on the temporary names of sequential cells. The chaining is only necessary because in one exemplary embodiment the retiming tool gives to the formal verification tool the atomic moves as logical relationships. The retiming tool of some embodiments does the chaining of the moves and supplies the formal verification tool with a molecular level move in file 210. Chaining is just an implementation convenience of such embodiments.

While some embodiments reverse backward moves on G4 and implements forward moves on F1 (adding white/black box combinations in each for both moves), other embodiments do the opposite reverse forward retiming moves as backward moves on G4 and execute backward retiming moves on F1. Note that although one illustrative method has been described above for connected component analysis, other methods may also be used, as will be apparent to the skilled artisan in view of this disclosure. Specifically, any labeling method that is commonly used in image processing (e.g. see section 4.1.3 of the book "Robot Vision" by BKP Horn, MIT Press, 1986) can be adapted for use as described above.

In some embodiments, although black boxes are only created after a large white box is subdivided into smaller white boxes, in alternative embodiments a black box may be created simultaneously with creation of a white box. In the just-described alternative embodiments a large black box and a large white box are created simultaneously, and when the white box is extended the black box is also extended, and when the white box is subdivided the black box is also subdivided.

Accordingly, numerous modifications and adaptations of the embodiments described herein are encompassed by the scope of the invention.

APPENDIX A

```
1
2   procedure split_moves(C) begin
3     foreach p in PI(C) do begin
4       if (driver(net(p)) is not a constant cell) begin
5         if (driver(net(p)) is not a sequential cell) error
6         if (size(PL(net(p))) > 1) begin
7           S_old := cell(driver(net(p))); create an in_pins set
8           add pair "":name(S_old) to in_pins
9           create an out_pins set
10          name(S_old) := get_temp_name( )
11          add pair "":name(S_old) to out_pins
12          S_new = new_cell( )
```

APPENDIX A-continued

```
13            name(S_new) := get_temp_name( )
14            add pair "":name(S_new) to out_pins
15            n = new_net( )
16            connect(p, n); connect(output(S_new), n)
17            connect(next_state(S_new), net(next_state(S_old))
18            write_svf(design, "FM_FORK", forward, in_pins, out_pins)
19          end if
20        end if
21      end foreach
22   end procedure
23
24   procedure main_forward_move(C) begin
25      create a set in_pins
26      foreach p in PI(C) do begin
27        if(driver(net(p)) is constant) begin
28          add pair name(p):constant_value(net(p) to in_pins
29        else
30          n := net(p); S := driver(net(p))
31          add pair name(p):name(S) to in_pins
32          connect(p, net(next_state(S))
33          remove n and S from the netlist
34        end if
35      end foreach
36      create a set out_pins
37      foreach p in PO(C) do begin
38        if(net(p) exists) begin
39          S := new_cell( ); name(S) := get_temp_name( )
40          add pair name(p):name(S) to out_pins
41          connect(output(S), net(p)); n := new_net( )
42          connect(p, n); connect(next_state(S), n)
43        end if
44      end foreach
45      write_svf(design, lib_Cell(C), forward, in_pins, out_pins)
46   end procedure
47
48   procedure merge_moves(C) begin
49      foreach p in PO(C) do begin
50        if (net(p)) exists ) begin
51          if (size(PL(net(p))) > 1) begin
52            create an in_pins set; create an out_pins set
53            S_new := new_cell( ); name(S_new) := get_temp_name( )
54            add pair "":name(S_new) to in_pins
55            n = new_net( )
56            connect(output(S_new), n); connect(next_state(S_new), net(p))
57            foreach l in PL(net(p)) begin
58              if(l != next_state(cell(l)) error
59              S_old := cell(l)
60              add pair "":name(S_old) to out_pins
61              foreach k in PL(net(output(S_old))) begin
62                connect(k, n)
63              end foreach
64              remove S_old and net(output(S_old))
65            end foreach
66            write_svf(design, "FM_FORK", backward, in_pins, out_pins)
67          end if
68        end if
69      end foreach
70   end procedure
71
72   procedure main_backward_move(C) begin
73      create a set out_pins
74      foreach p in PO(C) do begin
75        if(net(p) exists) begin
76          foreach l in PL(net(p)) begin
77          /* There is only one load pin. */
78          S := cell(l)
79          add pair name(p):name(S) to out_pins
80          remove net(p) from the netlist
81          connect(p, net(output(S)))
82          remove S from the netlist
83        end if
84      end foreach
85      create a set in_pins
86      foreach p in PI(C) do begin
87        S := new_cell( ); name(S) := get_temp_name( )
88        add pair name(p):name(S) to in_pins
89        connect(next_state(S), net(p))
90        n := new_net( )
91        connect(output(S), n)
92        connect(p, n)
```

APPENDIX A-continued

```
93    end foreach
94    write_svf(design, lib_Cell(C), backward, in_pins, out_pins)
95  end procedure
96
97  function can_execute_forward_move(C) begin
98    ok := 1
99    foreach p in PI(C) begin
100     if(driver(net(p)) is not sequential and net(p) is not constant)
101       begin; ok = 0; end if
102   end foreach
103   return ok
104 end function
105
106 function can_execute_backward_move(C) begin
107   ok := 1
108   foreach p in PO(C) begin
109     if(net(p) exists) begin
110       foreach l in PL(net(p)) begin
111         if(cell(l) is not sequential or
112            l != next_state(cell(l)) begin
113           ok = 0
114         end if
115       end foreach
116   end foreach
117   return ok
118 end function
119
120 procedure create_svf_moves(N) begin
121   create empty set F  /* Forward moves. */
122   foreach cell C in N begin    /* Find initial set of candidates. */
123     if(r(C) < 0) begin
124       if(can_execute_forward_move(C) = 1) begin
125         add C to F
126       end if
127     end if
128   end foreach
129   while(F is not empty) begin    /* Execute forward moves. */
130     foreach C in F begin
131       split_moves(C); main_forward_move(C)
132       r(C) := r(C) + 1
133       if((r(C) = 0) or (can_execute_forward_move(C) = 0))
134         begin; remove C from F; end if
135       foreach D in fanout(C) begin
136         if(r(D) < 0) begin
137           if(can_execute_forward_move(D) = 1) begin; add D to F; end if
138         end if
139       end foreach
140     end foreach
141   end while
142   /* Backward moves. */
143   foreach cell C in N begin    /* Find initial set of candidates. */
144     if(r(C) > 0) begin
145       if(can_execute_backward_move(C) = 1) begin
146         add C to F
147       end if
148     end if
149   end foreach
150   while(F is not empty) begin /* Execute backward moves. */
151     foreach C in F begin
152       merge_moves(C); main_backward_move(C)
153       r(C) := r(C) - 1
154       if((r(C) = 0) or (can_execute_backward_move(C) = 0))
155         begin; remove C from F; end if
156       foreach D in fanin(C) begin
157         if(r(D) > 0) begin
158           if(can_execute_backward_move(D) = 1) begin; add D to F;end if
159         end if
160       end foreach
161     end foreach
162   end while
163 end procedure
164
165 procedure final_sequential_cell_alignment(Ni, Ns) begin
166   foreach combinational cell C in Ni begin
167     foreach pin p in PO(C) begin
168       if(net_has_at_least_one_next_state_pin(net(p))) begin
169         align_pin_fanout(p, Nl, Ns);
170       end if
171     end foreach
172   end foreach
```

APPENDIX A-continued

```
173   end procedure
174
175   function net_has_at_least_one_next_state_pin(n) begin
176       foreach p in PL(n) begin
177           if(p = next_state(cell(p))) return 1; end if
178       end foreach
179       return 0
180   end function
181
182   procedure align_pin_fanout(p, Ni, Ns) begin
183       Ti := get_fanout_table(p, Ni)
184       Ts := get_fanout_table(p, Ns)
185       m = maximum length of all lists in Ti
186       for i = 0 to M−1 begin
187           create empty tables Mi, Ms
188           create_one_to_many_mappings(i, Ti, Ts, Mi, Ms)
189           write_table_svf_moves(Mi, "backward")
190           write_table_svf_moves(Ms, "forward")
191       end for
192   end procedure
193
194   procedure get_fanout_table(p, N) begin
195       create new table T; create new list L
196       get_fanout_table_recursive(p, N, T, L, 0)
197       return T
198   end procedure
199
200   procedure get_fanout_table_recursive (p, N, T, L, i) begin
201       foreach d in PL(p) begin
202           if(d = next_state(cell(d)) begin
203               L(i) := cell(d)
204               get_fanout_table_recursive(output(cell(d)), N, T, duplicate(L), i+1)
205           else T(d) := duplicate(L)
206           end if
207       end foreach
208   end procedure
209
210   procedure create_one_to_many_mappings(i, Ti, Ts, Mi, Ms) begin
211       foreach pin p in the keys of Ti begin
212           Li := Ti(p); Ls := Ts(p); Ci := Li(i); Cs := Ls(i)
213           if(Si := Mi(Ci) exists) begin
214               add Cs to Si
215           else if(Ss := Ms(Cs) exists) begin
216               add Ci to Ss
217           else if(Cs is the result of a forward move) begin
218               create new set Ss
219               add Ci to Ss
220               Ms(Cs) := Ss
221           else
222               create new set Si
223               add Cs to Si
224               Mi(Ci) := Si
225           end if
226       end foreach
227   end procedure
228
229   procedure write_table_svf_moves(M, direction) begin
230       foreach key C1 in M begin
231           create set in_pins; add pair "":name(C1) to in_pins
232           create set out_pins; S := M(C1)
233           foreach C2 in S; add pair "":name(C2) to out_pins; end foreach
234           write_svf(design, "FM_FORK", direction, in_pins, out_pins)
235       end foreach
236   end procedure
237
```

APPENDIX B

```
238
239   <command> == <retiming_move> | <end_retiming>
240   <retiming_move> == guide_retiming
241                       <design_spec>
242                       <direction_spec>
243                       <lib_cell_spec>
244                       <input_pin_spec>+
245                       <output_pin_spec>+
246                       [-resetStateDontCare]
247   <design_spec> == -design { <name> }
248   <direction_spec> == -direction { <dir> }
249   <dir> == forward | backward
250   <lib_cell_spec> == -libCell { <name> }
251   <input_pin_spec> == -input { <pin_reg_pair> }
252   <output_pin_spec> == -output { <pin_reg_pair> }
253   <pin_reg_pair> == [<pin_name>] : <connection>
254   <connection> == <reg_name> | 0 | 1
255   <pin_name> == <name>
```

APPENDIX B-continued

| | | |
|---|---|---|
| 256 | <reg_name> | == <name> |
| 257 | <end_retiming> | == guide_retiming_finished |
| 258 | <name> | == (any sequence of non-whitespace characters except colon) |

What is claimed is:

1. A non-transitory computer-readable storage media comprising instructions for electronic design automation, the instructions when executed by a processor are configured to:
   receive a reference integrated circuit (IC) design generated from a register transfer level (RTL) design, the reference IC design comprising a plurality of first instances of combinational cells, a plurality of first instances of sequential cells, and a plurality of first nets interconnecting the first instances of combinational cells and the first instances of sequential cells;
   receive a retimed IC design generated from a synthesized IC design, the synthesized IC design generated from the RTL design, wherein the retimed IC design comprises a plurality of second instances of combinational cells, a plurality of second instances of sequential cells, and a plurality of second nets interconnecting the second instances of combinational cells and the second instances of sequential cells;
   receive a description of moves of retiming that were performed on the synthesized IC design to generate the retimed IC design, a move of retiming describing a movement of a sequential cell from the synthesized IC design across a combinational cell from the synthesized IC design;
   replace at least one of the plurality of first instances of sequential cells from the reference IC design with an associated replacement circuit based on the description of moves of retiming to create a transformed reference IC design;
   replace at least one of the plurality of second instances of sequential cells from the retimed IC design with an associated replacement circuit based on the description of moves of retiming to create a transformed retimed IC design;
   compare the transformed reference IC design and the transformed retimed IC design; and
   determine whether the transformed retimed IC design is equivalent to the transformed reference IC design based on the comparison.

2. The non-transitory computer-readable storage media of claim 1 wherein the instructions when executed by the processor are further configured to:
   determine, from the description of moves, the associated replacement circuit that replaces the at least one of the plurality of first instances of sequential cells from the reference IC design, the associated replacement circuit comprising a white box design of one or more combinational cells.

3. The non-transitory computer-readable storage media of claim 1 wherein the instructions when executed by the processor are further configured to:
   determine, from the description of moves, the associated replacement circuit that replaces the at least one of the plurality of second instances of sequential cells from the retimed IC design, the associated replacement circuit comprising a white box design of one or more combinational cells.

4. The non-transitory computer-readable storage media of claim 3 wherein the associated replacement circuit further comprises a black box design that performs a function inverse to a function of the one or more combination cells included in the white box design.

5. The non-transitory computer-readable storage media of claim 1 wherein the instructions when executed by the processor are further configured to:
   determine whether the associated replacement circuit that replaces the at least one of the plurality of first instances of sequential cells from the reference IC design is based on a valid retiming move; and
   determine whether the associated replacement circuit that replaces the at least one of the plurality of second instances of sequential cells from the retimed IC design is based on a valid retiming move.

6. The non-transitory computer-readable storage media of claim 1 wherein the description describes the combinational cell as a Boolean function.

7. The non-transitory computer-readable storage media of claim 1 wherein the instructions when executed by the processor are further configured to:
   determine, from the description, a first group of moves associated with a first direction in which sequential cells are moved in the synthesized IC design;
   determine, from the description, a second group of moves associated with a second direction in which sequential cells are moved in the synthesized IC design; and
   create replacement circuits for the reference IC design and the retimed IC design based on the first group of moves and the second group of moves.

8. The non-transitory computer-readable storage media of claim 1 wherein the description is expressed at least partially in an eXtensible Markup Language (XML).

9. A computer-implemented method for electronic design automation, the method comprising:
   receiving a reference integrated circuit (IC) design generated from a register transfer level (RTL) design, the reference IC design comprising a plurality of first instances of combinational cells, a plurality of first instances of sequential cells, and a plurality of first nets interconnecting the first instances of combination cells and the first instances of sequential cells;
   receiving a retimed IC design generated from a synthesized IC design, the synthesized IC design generated from the RTL design, wherein the retimed IC design comprises a plurality of second instances of combinational cells, a plurality of second instances of sequential cells, and a plurality of second nets interconnecting the second instances of combinational cells and the second instances of sequential cells;
   receiving a description of moves of retiming that were performed on the synthesized IC design to generate the retimed IC design, a move of retiming describing a movement of a sequential cell from the synthesized IC design across a combinational cell from the synthesized IC design;
   replacing at least one of the plurality of first instances of sequential cells from the reference IC design with an associated replacement circuit based on the description of moves of retiming to create a transformed reference IC design;
   replacing at least one of the plurality of second instances of sequential cells from the retimed IC design with an associated replacement circuit based on the description of moves of retiming to create a transformed retimed IC design;
   comparing, by a computer, the transformed reference IC design and the transformed retimed IC design; and determining, by the computer, whether the transformed retimed IC design is equivalent to the transformed reference IC design based on the comparison.

10. The computer-implemented method of claim 9 further comprising:
determining, from the description of moves, the associated replacement circuit that replaces the at least one of the plurality of first instances of sequential cells from the reference IC design, the associated replacement circuit comprising a white box design of one or more combinational cells.

11. The computer-implemented method of claim 9 further comprising:
determining, from the description of moves, the associated replacement circuit that replaces the at least one of the plurality of second instances of sequential cells from the retimed IC design, the associated replacement circuit comprising a white box design of one or more combinational cells.

12. The computer-implemented method of claim 11 wherein the associated replacement circuit further comprises a black box design that performs a function inverse to a function of the one or more combination cells included in the white box design.

13. The computer-implemented method of claim 9 further comprising:
determining whether the associated replacement circuit that replaces the at least one of the plurality of first instances of sequential cells from the reference IC design is based on a valid retiming move; and
determining whether the associated replacement circuit that replaces the at least one of the plurality of second instances of sequential cells from the retimed IC design is based on a valid retiming move.

14. The computer-implemented method of claim 9 wherein the description describes the combinational cell as a Boolean function.

15. The computer-implemented method of claim 9 further comprising:
determining, from the description, a first group of moves associated with a first direction in which sequential cells are moved in the synthesized IC design;
determining, from the description, a second group of moves associated with a second direction in which sequential cells are moved in the synthesized IC design; and
creating replacement circuits for the reference IC design and the retimed IC design based on the first group of moves and the second group of moves.

16. An apparatus comprising:
a non-transitory computer-readable storage medium, the computer-readable storage medium comprising instructions when executed by a processor of the apparatus are configured to:
receive a reference integrated circuit (IC) design generated from a register transfer level (RTL) design, the reference IC design comprising a plurality of first instances of combinational cells, a plurality of first instances of sequential cells, and a plurality of first nets interconnecting the first instances combinational cells and the first instances of sequential cells;
receive a retimed IC design generated from a synthesized IC design, the synthesized IC design generated from the RTL design, wherein the retimed IC design comprises a plurality of second instances of combinational cells, a plurality of second instances of sequential cells, and a plurality of second nets interconnecting the second instances of combinational cells and the second instances of sequential cells;
receive a description of moves of retiming that were performed on the synthesized IC design to generate the retimed IC design, a move of retiming describing a movement of a sequential cell from the synthesized IC design across a combinational cell from the synthesized IC design;
replace at least one of the plurality of first instances of sequential cells from the reference IC design with an associated replacement circuit based on the description of moves of retiming to create a transformed reference IC design;
replace at least one of the plurality of second instances of sequential cells from the retimed IC design with an associated replacement circuit based on the description of moves of retiming to create a transformed retimed IC design;
compare the transformed reference IC design and the transformed retimed IC design; and
determine whether the transformed retimed IC design is equivalent to the transformed reference IC design based on the comparison.

17. The apparatus of claim 16 wherein the instructions when executed by the processor are further configured to:
determine, from the description of moves, the associated replacement circuit that replaces the at least one of the plurality of first instances of sequential cells from the reference IC design, the associated replacement circuit comprising a white box design of one or more combinational cells.

18. The apparatus of claim 16 wherein the instructions when executed by the processor are further configured to:
determine, from the description of moves, the associated replacement circuit that replaces the at least one of the plurality of second instances of sequential cells from the retimed IC design, the associated replacement circuit comprising a white box design of one or more combinational cells.

19. The apparatus of claim 18 wherein the associated replacement circuit further comprises a black box design that performs a function inverse to a function of the one or more combination cells included in the white box design.

20. The apparatus of claim 16 wherein the instructions when executed by the processor are further configured to:
determine whether the associated replacement circuit that replaces the at least one of the plurality of first instances of sequential cells from the reference IC design is based on a valid retiming move; and
determine whether the associated replacement circuit that replaces the at least one of the plurality of second instances of sequential cells from the retimed IC design is based on a valid retiming move.

21. The apparatus of claim 16 wherein the description describes the combinational cell as a Boolean function.

22. The apparatus of claim 16 wherein the instructions when executed by the processor are further configured to:
determine, from the description, a first group of moves associated with a first direction in which sequential cells are moved in the synthesized IC design;
determine, from the description, a second group of moves associated with a second direction in which sequential cells are moved in the synthesized IC design; and
create replacement circuits for the reference IC design and the retimed IC design based on the first group of moves and the second group of moves.

* * * * *

UNITED STATES PATENT AND TRADEMARK OFFICE
CERTIFICATE OF CORRECTION

PATENT NO. : 8,443,317 B2
APPLICATION NO. : 12/511987
DATED : May 14, 2013
INVENTOR(S) : Muzaffer Hiraoglu and Peter Wilhelm Josef Zepter Page 1 of 1

It is certified that error appears in the above-identified patent and that said Letters Patent is hereby corrected as shown below:

On the Title Page in the Related U.S. Application Data (62), insert after 2006 --, now U.S. Patent No. 8,453,083--.

Signed and Sealed this
Third Day of September, 2013

Teresa Stanek Rea
*Acting Director of the United States Patent and Trademark Office*